United States Patent
Cho

(10) Patent No.: US 11,422,739 B2
(45) Date of Patent: Aug. 23, 2022

(54) MEMORY CONTROLLER AND METHOD OF OPERATING THE SAME

(71) Applicant: SK hynix Inc., Gyeonggi-do (KR)

(72) Inventor: Hung Yung Cho, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 177 days.

(21) Appl. No.: 16/510,522

(22) Filed: Jul. 12, 2019

(65) Prior Publication Data
US 2020/0174699 A1    Jun. 4, 2020

(30) Foreign Application Priority Data

Dec. 3, 2018    (KR) ........................ 10-2018-0153585

(51) Int. Cl.
| | |
|---|---|
| G06F 3/06 | (2006.01) |
| G11C 16/26 | (2006.01) |
| G11C 16/04 | (2006.01) |
| G11C 11/56 | (2006.01) |

(52) U.S. Cl.
CPC .......... *G06F 3/0659* (2013.01); *G06F 3/0604* (2013.01); *G06F 3/0673* (2013.01); *G11C 16/0483* (2013.01); *G11C 16/26* (2013.01); *G11C 11/5621* (2013.01); *G11C 11/5671* (2013.01)

(58) Field of Classification Search
None
See application file for complete search history.

(56) References Cited

U.S. PATENT DOCUMENTS

| | | | | |
|---|---|---|---|---|
| 2010/0306370 | A1* | 12/2010 | Taniguchi | H04L 43/0817 709/224 |
| 2014/0068354 | A1* | 3/2014 | Park | G06F 11/0757 714/55 |
| 2016/0132237 | A1* | 5/2016 | Jeong | G06F 3/061 711/103 |
| 2016/0231950 | A1* | 8/2016 | Kim | G06F 3/0611 |
| 2016/0291873 | A1* | 10/2016 | Yi | G06F 3/061 |
| 2018/0032261 | A1* | 2/2018 | Singhai | G06F 3/0608 |
| 2019/0349959 | A1* | 11/2019 | Nguyen | H04L 27/0006 |

FOREIGN PATENT DOCUMENTS

| | | |
|---|---|---|
| KR | 10-2016-0120381 | 10/2016 |
| KR | 10-2018-0002367 | 1/2018 |

* cited by examiner

*Primary Examiner* — Charles Rones
*Assistant Examiner* — Jonah C Krieger
(74) *Attorney, Agent, or Firm* — IP & T Group LLP

(57) ABSTRACT

A memory controller controls a memory device including a memory cell array, and includes: a message information generator configured to receive a first request message from a host, and generate and output response characteristic information indicating a type of the first request message that defines a response time within which a message response to the first request message is provided to the host and a response output controller configured to determine, based on the response characteristic information, a time at which the message response corresponding to the first request message is output to the host.

13 Claims, 14 Drawing Sheets

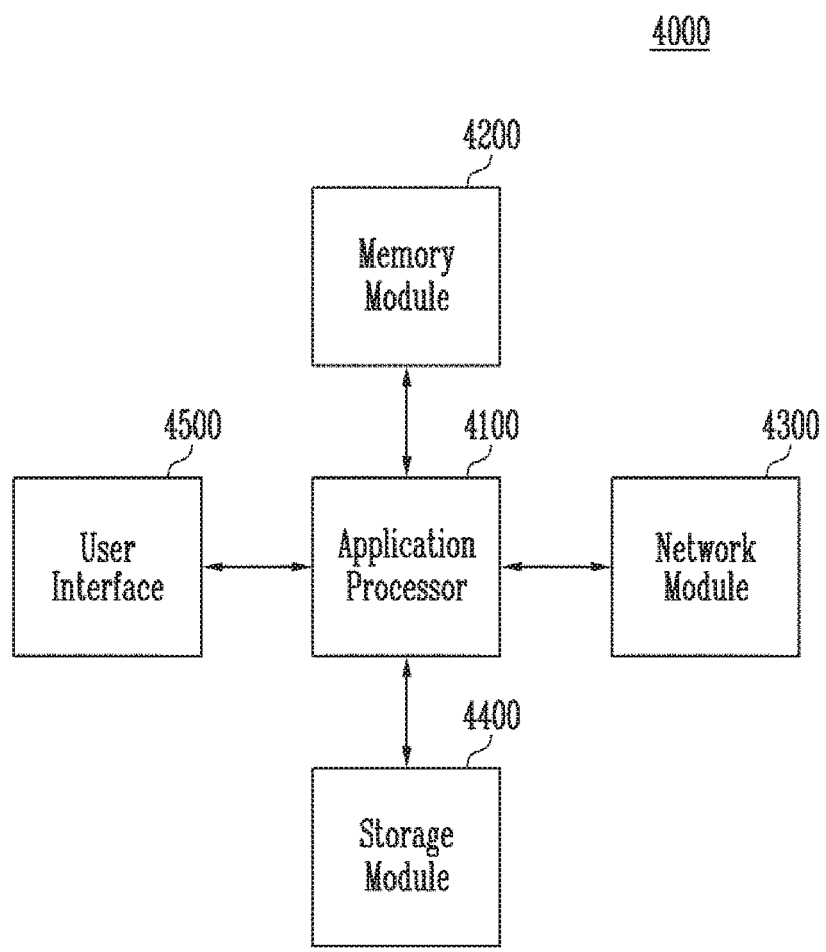

MEMORY CONTROLLER AND METHOD OF OPERATING THE SAME

CROSS-REFERENCE TO RELATED APPLICATION

The present application claims priority under 35 U.S.C. § 119(a) to Korean patent application number 10-2018-0153585, filed on Dec. 3, 2018, the entire disclosure of which is herein incorporated by reference in its entirety.

BACKGROUND

Field of Invention

Various embodiments of the present disclosure generally relate to an electronic device, and more particularly, to a memory controller and a method of operating the memory controller.

Description of Related Art

Generally, a storage device stores data under control of a host device such as a computer, a smartphone, or a smartpad. Examples of such a storage device include a hard disk drive (HDD) which stores data in a magnetic disk, and a solid state drive (SSD) or a memory card which stores data in a semiconductor memory, particularly, a nonvolatile memory.

The storage device may include a memory device in which data is stored, and a memory controller configured to store data in the memory device. Memory devices may be classified into volatile memories and nonvolatile memories. Representative examples of nonvolatile memories include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), and the like.

SUMMARY

Various embodiments of the present disclosure are directed to a memory controller configured to output a response in a reference time, and a method of operating the memory controller.

An embodiment of the present disclosure may provide for a memory controller configured to control a memory device including a memory cell array. The memory controller may include: a message information generator configured to receive a first request message from a host, and generate and output response characteristic information indicating a type of the first request message that defines a response time within which a message response to the first request message is provided to the host and a response output controller configured to determine, based on the response characteristic information, a time at which the message response corresponding to the first request message is output to the host.

An embodiment of the present disclosure may provide for a method of operating a memory controller configured to control a memory device including a memory cell array. The method may include: receiving a first request message from a host, generating and outputting response characteristic information indicating a type of the first request message that defines a response time within which a message response to the first request message is provided to the host and outputting the message response corresponding to the first request message based on the response characteristic information.

An embodiment of the present disclosure may provide for a memory controller configured to control a memory device including a memory cell array. The memory controller may include: a message information generator configured to receive a request message from a host, and generate and output response characteristic information including information about whether the request message is a priority response request message or a normal response request message and a response output controller configured to output, when the response characteristic information include information about the priority response request message, a message response to the host before the memory device reperforms a failed operation, the message response indicating that the operation has failed.

An embodiment of the present disclosure may provide for a method of operating a host configured to control a storage device configured to store data. The method may include: determining a request message to be one of a normal response request message and a priority response request message to perform a specific operation on the storage device, generating and outputting the determined request message and receiving a message response corresponding to the determined request message, wherein the receiving of the message response comprises: receiving, when the determined request message is the normal response request message, the message response after the specific operation is completed and receiving, when the determined request message is the priority response request message, the message response before or after the specific operation is completed.

An embodiment of the present disclosure may provide for a method of operating a memory system. The method may include: controlling a memory device to perform an operation in response to a priority response request message from a host, the priority response request message requesting an operation response within a set response time, providing a fail response to the host when the operation response cannot be provided to the host within the response time as a result of the operation not being completed by the memory device and providing the operation response to the host upon completion of the operation of the memory device.

BRIEF DESCRIPTION OF THE DRAWINGS

FIG. 16 is a block diagram illustrating a user system to which the storage device in accordance with an embodiment of the present disclosure is applied.

DETAILED DESCRIPTION

Figure 1:
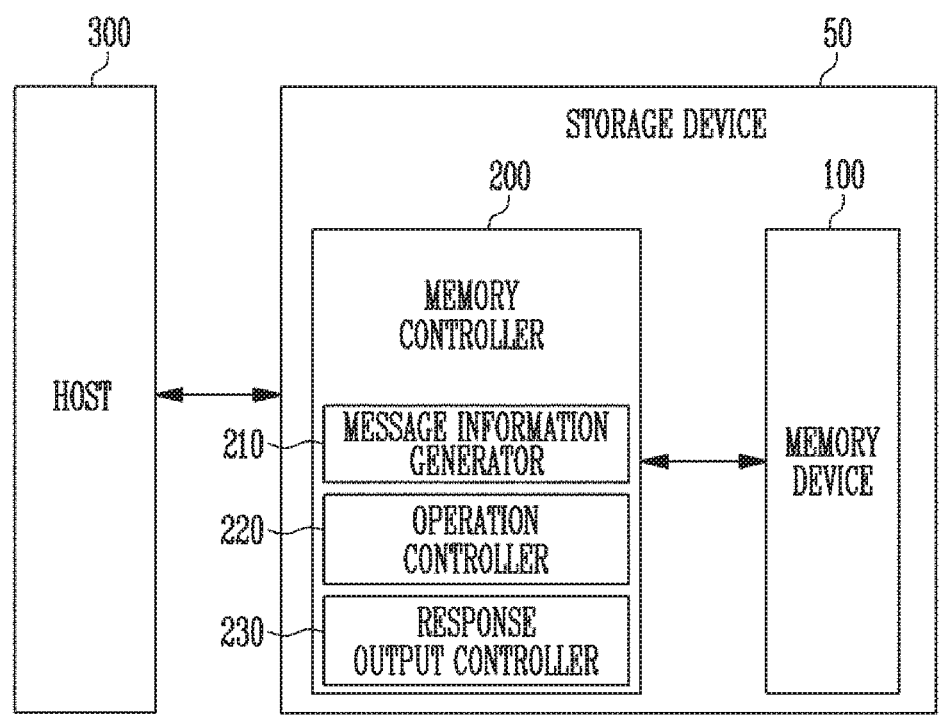
FIG. 1 is a block diagram illustrating a storage device in accordance with an embodiment of the present disclosure.

Specific structural and functional description herein is for the purpose of describing embodiments of the present disclosure. The present invention, however, is not limited to the embodiments described herein. Rather, the present invention may be embodied in many different forms, any of which may be a modification or variation of one or more disclosed embodiments. The present invention is intended to embrace all such different forms, modifications and variations to the extent they fall within the scope of the claims.

It will be understood that, although the terms "first", "second", etc. may be used herein to identify various elements, these elements are not limited by these terms. These terms are only used to distinguish one element from another element that otherwise have the same or similar names. For example, a first element in one instance could be termed a second element in another instance, and vice versa, without departing from the teachings of the present disclosure.

It will be understood that when an element is referred to as being "coupled" or "connected" to another element, it can be directly coupled or connected to the other element or one or more intervening elements may be present. In contrast, it should be understood that when an element is referred to as being "directly coupled" or "directly connected" to another element, there are no intervening elements present. Other expressions that explain the relationship between elements, such as "between", "directly between", "adjacent to" or directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that open-ended terms such as "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art and will not be interpreted in an idealized or overly formal sense unless expressly so defined herein.

Detailed description of functions and structures well known to those skilled in the art is omitted to avoid obscuring the subject matter of the present disclosure. This aims to omit unnecessary description so as to make the subject matter of the present disclosure clear.

Various embodiments of the present disclosure will now be described more fully with reference to the accompanying drawings, in which preferred embodiments of the present disclosure are shown, so that those skilled in the art can easily carry out and practice the present invention. Throughout the specification, reference to "an embodiment," "another embodiment" or the like is not necessarily to only one embodiment, and different references to any such phrase are not necessarily to the same embodiment(s).

FIG. 1 is a block diagram illustrating a storage device 50 in accordance with an embodiment of the present disclosure.

Referring to FIG. 1, the storage device 50 may include a memory device 100 and a memory controller 200.

The storage device 50 may be configured to store data under control of a host 300 such as a cellular phone, a smartphone, an MP3 player, a laptop computer, a desktop computer, a game machine, a TV, a tablet PC, or an in-vehicle infotainment system.

The storage device 50 may be any of various kinds of storage devices depending on a host interface, which is a communication system with the host 300. For example, the storage device 50 may be configured of any of various kinds of storage devices such as an SSD, MMC, eMMC, RS-MMC, or micro-MMC type multimedia card, an SD, mini-SD, micro-SD type secure digital card, a universal serial bus (USB) storage device, a universal flash storage (UFS) device, a personal computer memory card international association (PCMCIA) card type storage device, a peripheral component interconnection (PCI) card type storage device, a PCI-express (PCI-E) type storage device, a compact flash (CF) card, a smart media card, and a memory stick.

The storage device 50 may be manufactured in the form of any of various package types. For instance, the storage device 50 may be manufactured as any of various package types such as a package on package (POP) type, a system in package (SIP) type, a system on chip (SOC) type, a multi-chip package (MCP) type, a chip on board (COB) type, a wafer-level fabricated package (WFP) type, and a wafer-level stack package (WSP) type.

The memory controller 200 may control overall operations of the storage device 50.

When power is applied to the storage device 50, the memory controller 200 may execute firmware. In the case where the memory device 100 is a flash memory device, the memory controller 200 may execute firmware such as a flash translation layer (FTL) for controlling communication between the host 300 and the memory device 100.

The memory controller 200 may include a message information generator 210. The message information generator 210 may receive a request message REQ_MSG from the host 300. The request message REQ_MSG received from the host 300 may be a normal response request message or a priority response request message. The priority response request message may be for requesting a message response MSG_RES within a set or predetermined time. The message response MSG_RES may indicate a result of an operation performed by the memory device 100 in response to the request message REQ_MSG. The normal response request message may be for requesting a message response MSG_RES to be provided to the host 300 when the memory controller receives an indication of a completed operation after the operation performed by the memory device 100 has been completed in response to the request message REQ_MSG.

In an embodiment, the message information generator 210 may generate response characteristic information RC_INF. The response characteristic information RC_INF may include information about whether the request message REQ_MSG is a priority response request message or a normal response request message. In other words, the response characteristic information RC_INF may include information indicating the type of request message REQ_MSG that defines a specific or conditional point in time at which a response to the request message REQ_MSG is to be provided to the host 300. The message information generator 210 may output the response characteristic information RC_INF to the response output controller 230, which may determine when the message response MSG_RES is to be output based on the response characteristic information RC_INF.

The memory controller 200 may include an operation controller 220. The operation controller 220 may receive a request message REQ_MSG from the host 300. The operation controller 220 may generate a command CMD corresponding to the request message REQ_MSG and output the command CMD to the memory device 100. The operation controller 220 may receive, from the memory device 100, a command response CMD_RES which is a response to the command CMD.

The operation controller 220 may generate operation completion information OC_INF based on operation pass or fail information included in the command response CMD_RES. In other words, the operation completion information OC_INF may include success/pass or failure/fail indication information of the command response CMD_RES. The operation controller 220 may output the operation completion information OC_INF to the response output controller 230.

The memory controller 200 may include the response output controller 230, which may receive the response characteristic information RC_INF from the message information generator 210. The response output controller 230 may determine a point in time at which the message response MSG_RES is output based on the received response characteristic information RC_INF. In other words, depending on whether the request message REQ_MSG is a priority response request message or a normal response request message, the time at which the message response MSG_RES is output may be determined. In the case where the response characteristic information RC_INF includes information indicating the priority response request message, time elapsed before the response output controller 230 outputs the message response MSG_RES to the host may be shorter than when the response characteristic information RC_INF includes information indicating the normal response request message. The message response MSG_RES may indicate whether the operation performed by the memory device 100 has passed or failed, based on the operation completion information OC_INF provided from the operation controller 220.

The memory device 100 may store data therein. The memory device 100 may operate under control of the memory controller 200. The memory device 100 may include a memory cell array including a plurality of memory cells configured to store data therein. The memory cell array may include a plurality of memory blocks. Each memory block may include a plurality of memory cells. Each memory block may include a plurality of pages. In an embodiment, each page may be the unit of storing data in the memory device 100 or reading stored data from the memory device 100. Each memory block may be the unit of erasing data. In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), a NAND flash memory, a vertical NAND flash memory, a NOR flash memory device, a resistive random access memory (RRAM), a phase-change random access memory (PRAM), a magnetoresistive random access memory (MRAM), a ferroelectric random access memory (FRAM), or a spin transfer torque random access memory (STT-RAM). In this specification, aspects and features of the invention are described in the context of the memory device 100 being a NAND flash memory.

In an embodiment, the memory device 100 may be embodied in a three-dimensional array structure. The present disclosure may be applied not only to a flash memory in which a charge storage layer is formed of a conductive floating gate (FG), but also to a charge trap flash (CTF) memory in which a charge storage layer is formed of an insulating layer.

In an embodiment, each of the memory cells included in the memory device 100 may be formed of a single-level cell (SLC) capable of storing one data bit. Alternatively, each of the memory cells included in the memory device 100 may be formed of a multi-level cell (MLC) capable of storing two data bits, a triple-level cell (TLC) capable of storing three data bits, or a quad-level cell (QLC) capable of storing four data bits.

The memory device 100 may receive a command and an address from the memory controller 200 and access a region of the memory cell array that is selected by the address. In other words, the memory device 100 may perform an operation corresponding to the command on the region selected by the address. For example, the memory device 100 may perform a write (program) operation, a read operation, and an erase operation. During a program operation, the memory device 100 may program data to a region selected by an address. During a read operation, the memory device 100 may read data from a region selected by an address. During an erase operation, the memory device 100 may erase data from a region selected by an address.

The memory device 100 may perform a program operation or an erase operation using a set operating voltage under control of the memory controller 200.

In an embodiment, the memory controller 200 may receive data and a logical address (LA) from the host 300, and translate the LA into a physical address (PA) indicating addresses of memory cells to which data is to be stored, the memory cells being included in the memory device 100. In addition, the memory controller 200 may store, in a buffer memory, mapping information indicating a mapping relationship between the LA and the PA.

The memory controller 200 may control the memory device 100 to perform a program operation, a read operation, or an erase operation in response to a request from the host 300. During the program operation, the memory controller 200 may provide a program command, a PA, and data to the memory device 100. During a read operation, the memory controller 200 may provide a read command and a PA to the memory device 100. During an erase operation, the memory controller 200 may provide an erase command and a PA to the memory device 100.

In an embodiment, the memory controller 200 may autonomously generate a program command, an address and data without a request from the host 300, and transmit them to the memory device 100. For example, the memory controller 200 may provide a command, an address and data to the memory device 100 to perform background operations such as a program operation for wear leveling, and a program operation for garbage collection.

In an embodiment, the memory controller 200 may control two or more memory devices 100. In this case, the memory controller 200 may control the memory devices 100 in an interleaving manner so as to enhance the operating performance.

The host 300 may communicate with the storage device 50 using at least one of various communication methods such as universal serial bus (USB), serial AT attachment (SATA), serial attached SCSI (SAS), high speed interchip (HSIC), small computer system interface (SCSI), peripheral component interconnection (PCI), PCI express (PCIe), non-volatile memory express (NVMe), universal flash storage (UFS), secure digital (SD), multimedia card (MMC), embedded MMC (eMMC), dual in-line memory module (DIMM), registered DIMM (RDIMM), and load reduced DIMM (LRDIMM) communication methods.

In an embodiment, the host 300 may determine either a normal response request message or a priority response request message to perform a specific operation on the storage device 50. The host 300 may generate and output a determined request message REQ_MSG. The host 300 may receive a message response MSG_RES corresponding to the determined request message REG_MSG. When the determined request message REQ_MSG is a normal response request message, the host 300 may receive the message response MSG_RES after the operation of the storage device 50 is completed in response to the normal response request message. When the determined request message REQ_MSG is a priority response request message, the host 300 may receive the message response MSG_RES before or after the operation of the storage device 50 is completed in response to the priority response request message.

In an embodiment, when the request message REQ_MSG is determined to be a priority response request message, if the host 300 receives the message response MSG_RES before the operation of the storage device 50 is completed, it may be determined to generate and output a priority response request message identical with the preceding priority response request message. If the host 300 generates and outputs such a priority response request message, the memory device 100 may perform an operation corresponding to the preceding priority response request message. If the host 300 generates and outputs a new request message, the memory device 100 may perform an operation corresponding to the new request message.

Figure 2:
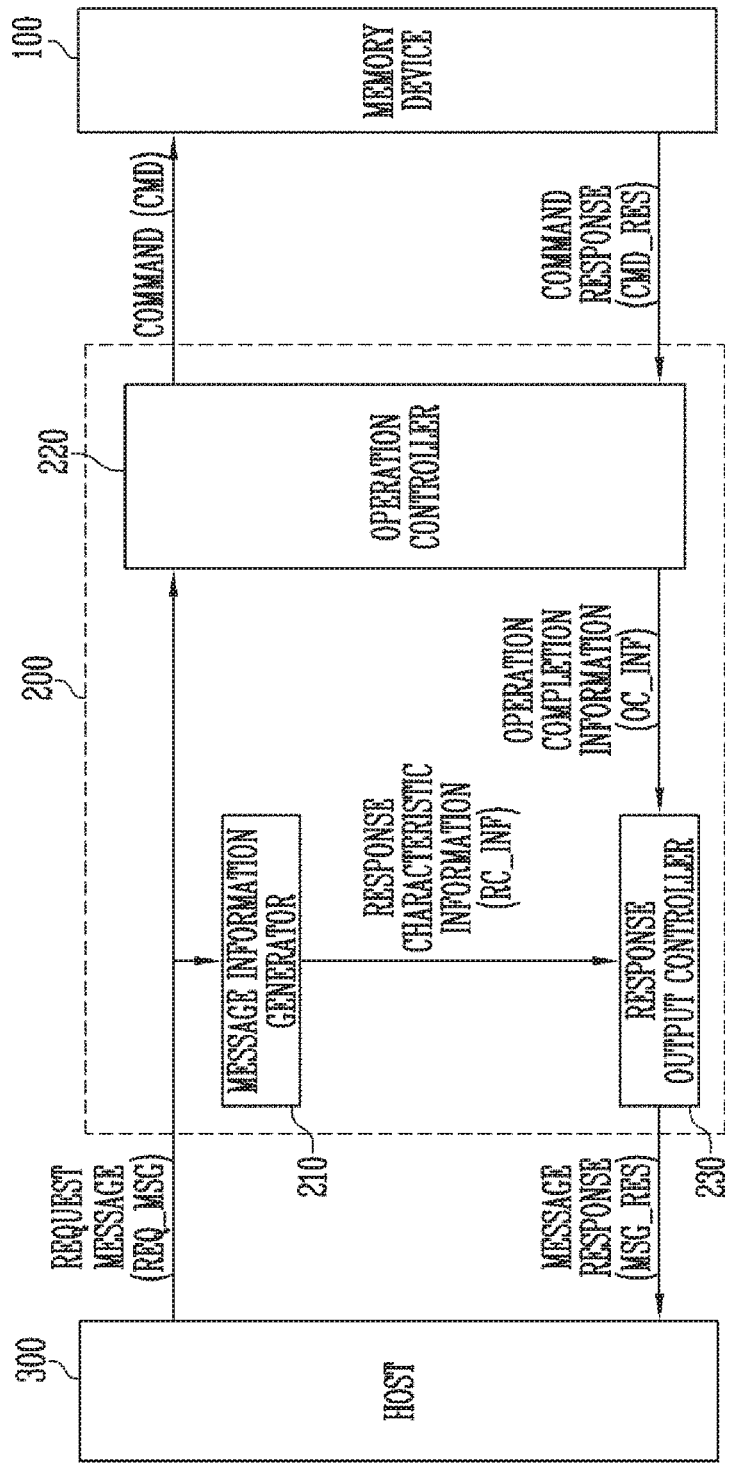
FIG. 2 is a diagram illustrating a configuration of a memory controller, such as that of FIG. 1, and an operation of outputting a message in response to a request of a host.

FIG. 2 is a diagram for describing the configuration of the memory controller 200 of FIG. 1 and an operation of outputting a message response in response to a request message of the host 300 of FIG. 1, in accordance with an embodiment of the present disclosure.

Referring to FIG. 2, the memory controller 200 may include the message information generator 210, the operation controller 220, and the response output controller 230.

The message information generator 210 may receive a request message REQ_MSG from the host 300. The request message REQ_MSG may be either a priority response request message or a normal response request message. The message information generator 210 may generate and output response characteristic information RC_INF based on the request message REQ_MSG. The response characteristic information RC_INF may include information about whether the request message REQ_MSG is a priority response request message or a normal response request message. In other words, based on the response characteristic information RC_INF, a time of response to the request message REQ_MSG may be determined. The message information generator 210 may provide the response characteristic information RC_INF to the response output controller 230.

In an embodiment, the priority response request message may be for requesting a message response MSG_RES within a set or predetermined time. In other words, the priority response request message may be for requesting a result of an operation performed by the memory device 100 in response to the request message REQ_MSG before the memory device 100 completes the operation. The normal response request message may be for requesting a message response MSG_RES when a result of an operation performed by the memory device 100 is received by the memory controller after the operation performed by the memory device 100 has been completed. Therefore, the priority response request message may require a shorter response time within which the message response MSG_RES to the request message REQ_MSG is provided to the host 300 than the normal response request message.

In an embodiment, the operation controller 220 may receive the request message REQ_MSG from the host 300. The operation controller 220 may generate a command CMD corresponding to the request message REQ_MSG and output the command CMD to the memory device 100. The memory device 100 may perform an operation in response to the command CMD received from the operation controller 220. The operation controller 220 may receive, from the memory device 100, a command response CMD_RES in response to the command CMD. The command response CMD_RES may include a result of the operation performed in response to the command CMD.

Based on the command response CMD_RES, it may be determined whether the operation has passed or failed. The operation controller 220 may generate operation completion information OC_INF based on pass/fail information included in the command response CMD_RES. In detail, the operation controller 220 may generate operation completion information OC_INF that includes the operation pass/fail information of the command response CMD_RES based on the command response CMD_RES. The operation controller 220 may output the operation completion information OC_INF to the response output controller 230.

In an embodiment, the operation controller 220 may determine whether the operation has passed or failed based on the command response CMD_RES. The command response CMD_RES may indicate a result of the operation performed by the memory device 100 in response to the command CMD. In other words, the command response CMD_RES may indicate a result of a program operation, a read operation, or an erase operation performed by the memory device 100 in response to the command CMD.

In the case of the program operation, if a command response CMD_RES including information that program data has been stored in a memory cell is received, it may be determined that the corresponding operation has passed. If not, it may be determined that the corresponding operation has failed. In the case of a verify operation, if a command response CMD_RES including information that a threshold voltage of the corresponding memory cell is higher than a verify voltage is received, it may be determined that the corresponding operation has passed. If not, it may be determined that the corresponding operation has failed. In the case of the read operation, if a command response CMD_RES including information that read data corresponds to the program data is received, it may be determined that the corresponding operation has passed. If not, it may be determined that the corresponding operation has failed.

Therefore, the operation controller 220 may determine whether the program operation, the read operation, or the erase operation passed or failed, based on the operation pass/fail information in the command response CMD_RES. Furthermore, the operation controller 220 may generate and output operation completion information OC_INF indicating pass or fail of the operation based on the command response CMD_RES.

In an embodiment, the operation controller 220 may receive a command response CMD_RES from the memory device 100. Based on the command response CMD_RES, the operation controller 220 may determine that an operation performed by the memory device 100 has failed.

The operation controller 220 may output operation completion information OC_INF to the response output controller 230, and thereafter generate a command CMD for performing the failed operation again and output the command CMD to the memory device 100. If the failed operation is a write operation, the operation controller 220 may generate a command CMD for reperforming the write operation on another physical address in a memory cell array included in the memory device 100, and output the command CMD to the memory device 100.

In detail, in the case a request message REQ_MSG previously received from the host 300 is a write request message, the operation controller 220 may change a physical block address and output the changed physical block address to the memory device 100 so that the write operation is performed again on another physical block address in the memory cell array in response to the write request message.

In the case where the failed operation is a read operation, the operation controller 220 may generate a command CMD for reperforming the read operation at a read voltage level different from that of the previously failed read operation, and output the command CMD to the memory device 100. The memory device 100 may perform a read operation again with the different read voltage level in response to the command CMD provided from the operation controller 220.

In detail, in the case where the request message REQ_MSG previously received from the host 300 is a read request message, the operation controller 220 may change a read voltage level related to a command corresponding to the read request message and output the changed read voltage level to the memory device 100 so that the read operation may be performed at a read voltage level different from that of the previously-performed read operation.

In an embodiment, the operation controller 220 may receive a new request message from the host 300. The operation controller 220 may receive the new request message after the response output controller 230 has output a message response MSG_RES. The new request message may be received even after the response output controller 230 has output a message response MSG_RES indicating priority response fail. The message response MSG_RES that indicates the priority response fail may be output as a response to the priority response request message when the response output controller 230 does not receive the operation completion information OC_INF within a reference time defined by the priority response request message. The reference time may be preset.

The operation controller 220 may generate a command CMD for reperforming an operation until a new request message is received from the host 300, and output the generated command CMD to the memory device 100. The new request message may be the same request message as the preceding request message.

If the new request message is the same as the preceding request message, the operation controller 220 may generate a command CMD corresponding to the preceding request message and output the command CMD to the memory device 100. In other words, a command corresponding to the new request message may be identical with the command corresponding to the preceding request message. Therefore, the operation controller 220 may receive a command response CMD_RES corresponding to the command related to the preceding request message and generate operation completion information OC_INF.

If the new request message is different from the preceding request message, the operation controller 220 may generate a command CMD corresponding to the new request message and output the command CMD to the memory device 100.

If the new request message is received from the host 300, the operation controller 220 may not generate a command CMD for reperforming the failed operation. Hence, the operation controller 220 may generate a command CMD corresponding to the new request message and output the command CMD to the memory device 100. The operation controller 220 may receive, from the memory device 100, a command response CMD_RES in response to the command CMD.

If response characteristic information RC_INF about the new request message identical with the preceding request message is received from the message information generator 210, the response output controller 230 may output a message response MSG_RES based on previously-received operation completion information OC_INF. The operation completion information OC_INF may include success or failure indication information of the command response CMD_RES.

The response output controller 230 may receive the response characteristic information RC_INF from the message information generator 210. The response characteristic information RC_INF may include information about whether the request message REQ_MSG is a priority response request message or a normal response request message. The response output controller 230 may determine a time at which the message response MSG_RES is output based on the response characteristic information RC_INF. The priority response request message may be for requesting a message response MSG_RES within a set or predetermined time. The message response MSG_RES may indicate a result of an operation performed by the memory device 100. The normal response request message may be for requesting a message response MSG_RES when the memory controller receives, after the operation performed by the memory device 100 has been completed, a result of the completed operation.

In an embodiment, the response output controller 230 may receive operation completion information OC_INF from the operation controller 220. The operation completion information OC_INF may include information about whether the operation performed by the memory device 100 has passed or failed in response to the request message REQ_MSG. When the operation completion information OC_INF is received, the response output controller 230 may output a message response MSG_RES indicating pass or fail of the corresponding operation based on the operation completion information OC_INF.

In detail, if the request message is a normal response request message, the response output controller 230 may output a message response MSG_RES when the operation completion information OC_INF is received. If the request message is a priority response request message, the response output controller 230 may output a message response MSG_RES based on whether the operation completion information OC_INF has been received within a reference time, which may be preset. The response output controller 230 may include a first message response output component 231 configured to output a first message response corresponding to the operation completion information OC_INF, and a second message response output component 232 configured to output a second message response corresponding to the operation completion information OC_INF and the reference time.

In an embodiment, in the case where the request message is a priority response request message, the response output controller 230 may output, if the operation completion information OC_INF has been received within the reference time, a message response MSG_RES when the operation completion information OC_INF is received. The reference time may be preset. If the operation completion information OC_INF has not been received within the reference time, the response output controller 230 may output a message response MSG_RES indicating priority response fail when the reference time has elapsed. The message response MSG_RES that indicates priority response fail may be output as a response to the priority response request message when the response output controller 230 does not receive the operation completion information OC_INF within the response time defined by the priority response request message. The message response MSG_RES that indicates the priority response fail may indicate that the memory device 100 is performing the operation corresponding to the command CMD. The operation controller 220 may receive a new request message from the host 300 after the message response MSG_RES that indicates the priority response fail has been output.

In an embodiment, the response output controller 230 may output the message response MSG_RES to the host even if the operation completion information OC_INF has not been received from the operation controller 220 within the reference time. In detail, the case where the response output controller 230 has not received the operation completion information OC_INF may be the case where the memory device 100 is performing an operation or reperforming a failed operation. The case where the response output controller 230 has not received the operation completion information OC_INF may be the case where an operation has not passed. Therefore, the response output controller 230 may output a message response MSG_RES indicating that the operation has failed to the host 300 even if the operation completion information OC_INF has not been received from the operation controller 220. In other words, the response output controller 230 may output a message response MSG_RES that indicates the priority response fail to the host 300.

Figure 3:
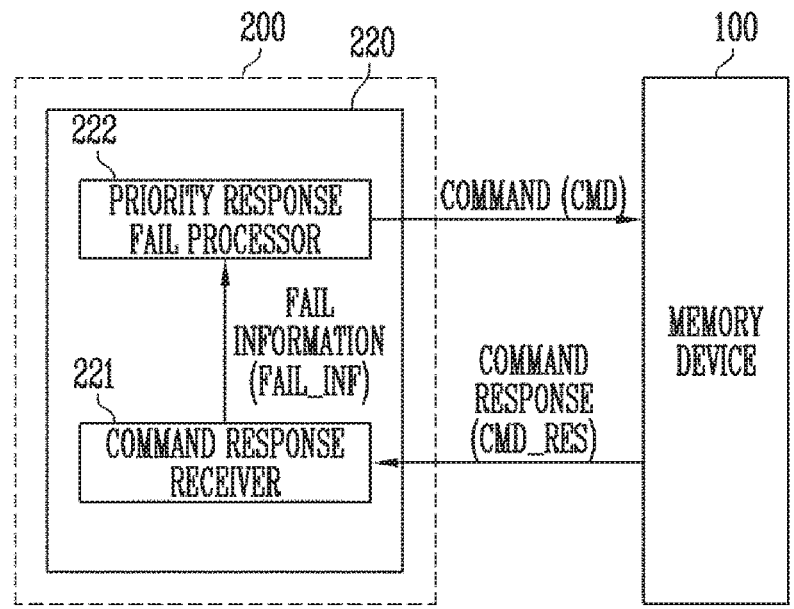
FIG. 3 is a diagram illustrating the structure of an operation controller, such as that of FIG. 2.

FIG. 3 is a diagram illustrating structure of the operation controller 220 of FIG. 2.

Referring to FIG. 3, the operation controller 220 may include a command response receiver 221 and a priority response fail processor 222. The operation controller 220 may generate a command CMD corresponding to the request message REQ_MSG and output the command CMD to the memory device 100. The operation controller 220 may receive, from the memory device 100, a command response CMD_RES in response to the command CMD. FIG. 3 illustrates an operation of the operation controller 220 after an operation corresponding to the command CMD has failed.

The command response receiver 221 may receive, from the memory device 100, a command response CMD_RES in response to the command CMD. The command response receiver 221 may determine whether the operation performed by the memory device 100 has passed or failed based on the command response CMD_RES. The command response CMD_RES may include a result (e.g., pass or fail) of the operation performed in response to the command CMD. The command response receiver 221 may generate and output operation completion information OC_INF based on the command response CMD_RES received from the memory device 100. The command response receiver 221 may output the operation completion information OC_INF to the response output controller 230.

In the case where the operation performed by the memory device 100 has failed in response to the command CMD, the command response receiver 221 may generate and output fail information FAIL_INF including information about fail of the operation. The fail information FAIL_INF may include information for an error correction operation. In other words, the fail of the operation performed by the memory device 100 may refer to fail of the operation before the error correction operation is performed.

In an embodiment, the command response receiver 221 may output the fail information FAIL_INF to the priority response fail processor 222. The fail information FAIL_INF may include information for reperforming the failed operation. In other words, the fail information FAIL_INF may include information for performing by the memory device 100 the error correction operation. The priority response fail processor 222 may generate a command CMD for reperforming the failed operation after having received the fail information FAIL_INF from the command response receiver 221.

In detail, in the case where the failed operation is a write operation, the priority response fail processor 222 may generate a command CMD for reperforming the write operation on another physical address in a memory cell array included in the memory device 100, and output the command CMD to the memory device 100.

In an embodiment, in the case a request message REQ_MSG previously received from the host 300 is a write request message, the operation controller 220 may change a physical block address and output the changed physical block address to the memory device 100 so that the write operation is performed again on another physical block address in the memory cell array in response to the write request message.

In the case where the failed operation is a read operation, the operation controller 220 may generate a command CMD for reperforming the read operation at a read voltage level different from that of the previously failed read operation, and output the command CMD to the memory device 100. The memory device 100 may perform a read operation again with the different read voltage level in response to the command CMD provided from the priority response fail processor 222.

In detail, in the case where the request message REQ_MSG previously received from the host 300 is a read request message, the operation controller 220 may change a read voltage level related to a command corresponding to the read request message and output the changed read voltage level to the memory device 100 so that the command may be performed at a read voltage level different from that of the previous command.

In an embodiment, the priority response fail processor 222 may generate a command CMD for reperforming the failed operation until a new request message is received from the message information generator 210, and output the generated command CMD to the memory device 100. The new request message may be an additional result request message which requests an additional result for the failed operation, or may be a request message for a new operation to be performed on the memory device. The new request message may be a request message equal to or different from the preceding request message.

Figure 4:
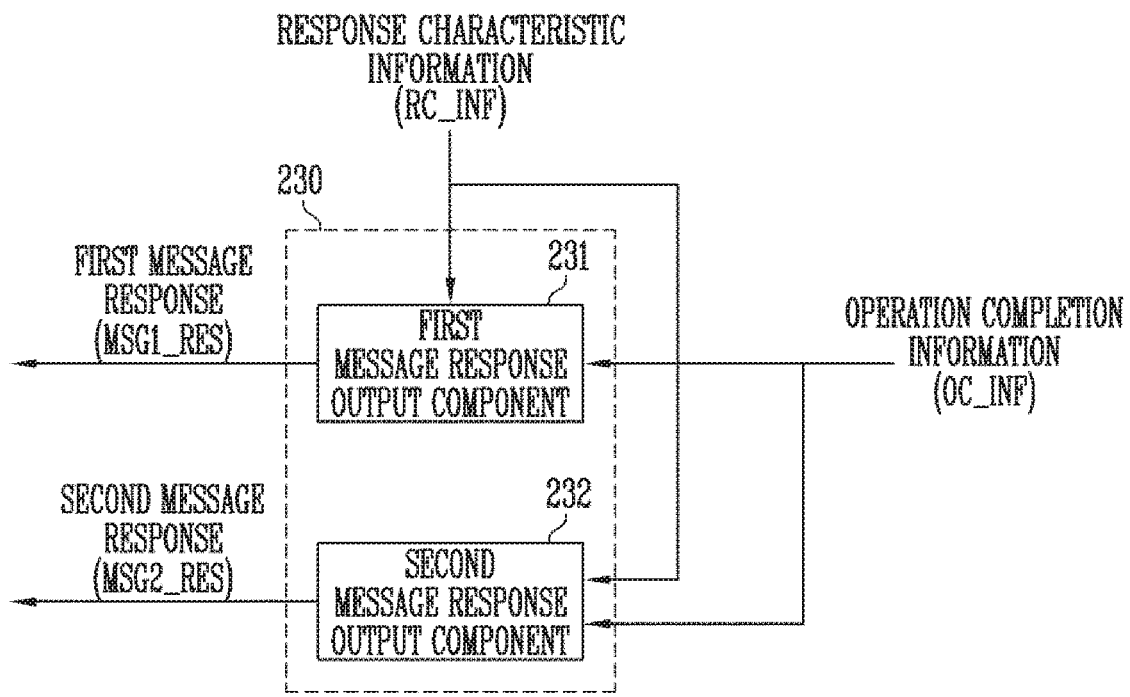
FIG. 4 is a diagram illustrating the structure of a response output controller, such as that of FIG. 2.

FIG. 4 is a diagram illustrating structure of the response output controller 230 of FIG. 2.

Referring to FIG. 4, the response output controller 230 may include the first message response output component 231 and the second message response output component 232. The first message response output component 231 and the second message response output component 232 may receive response characteristic information RC_INF from the message information generator 210. The response characteristic information RC_INF may include information about whether the request message REQ_MSG is a priority response request message or a normal response request message. The first message response output component 231 and the second message response output component 232 may receive operation completion information OC_INF from the operation controller 220. The response output controller 230 may determine output of the message response MSG_RES based on the response characteristic information RC_INF and the operation completion information OC_INF. The operation completion information OC_INF may include information about whether the operation performed by the memory device 100 has been completed in response to the request message REQ_MSG and whether the operation has passed or failed.

In an embodiment, the first message response output component 231 may output a first message response MSG1_RES based on the operation completion information OC_INF. The first message response MSG1_RES may indicate pass or fail of the operation.

In detail, if a request message REQ_MSG is a normal response request message, the first message response output component 231 may output a first message response MSG1_RES when the operation completion information OC_INF is received. If the request message REQ_MSG is a priority response request message and the first message response output component 231 receives the operation completion information within a reference time, the first message response output component 231 may output a first message response MSG1_RES when the operation completion information OC-INF is received. If the request message REQ_MSG is a priority response request message and the first message response output component 231 does not receive the operation completion information within the reference time, the first message response output component 231 may remain on standby.

In an embodiment, the second message response output component 232 may output a second message response MSG2_RES based on the operation completion information OC_INF. The second message response MSG2_RES may indicate pass or fail of the operation.

In detail, if the request message REQ_MSG is a priority response request message and the operation completion information OC_INF is not received within the reference time, the second message response output component 232 may output the second message response MSG2_RES indicating priority response fail when the reference time has elapsed. The message response MSG_RES that indicates priority response fail may be output as a response to the priority response request message when the response output controller 230 does not receive the operation completion information OC_INF within the response time (i.e., the reference time) defined by the priority response request message. In other words, the second message response output component 232 may output the message response MSG_RES when the request message REQ_MSG is a priority response request message and the operation completion information OC_INF has not been received within the reference time. The second message response MSG2_RES may indicate that an operation corresponding to the priority response request message is being performed. If the second message response output component 232 outputs a second message response MSG2-RES indicating priority response fail, the operation controller 220 may receive a new request message from the host 300. The new request message may be equal to or different from the preceding request message.

Figure 5:
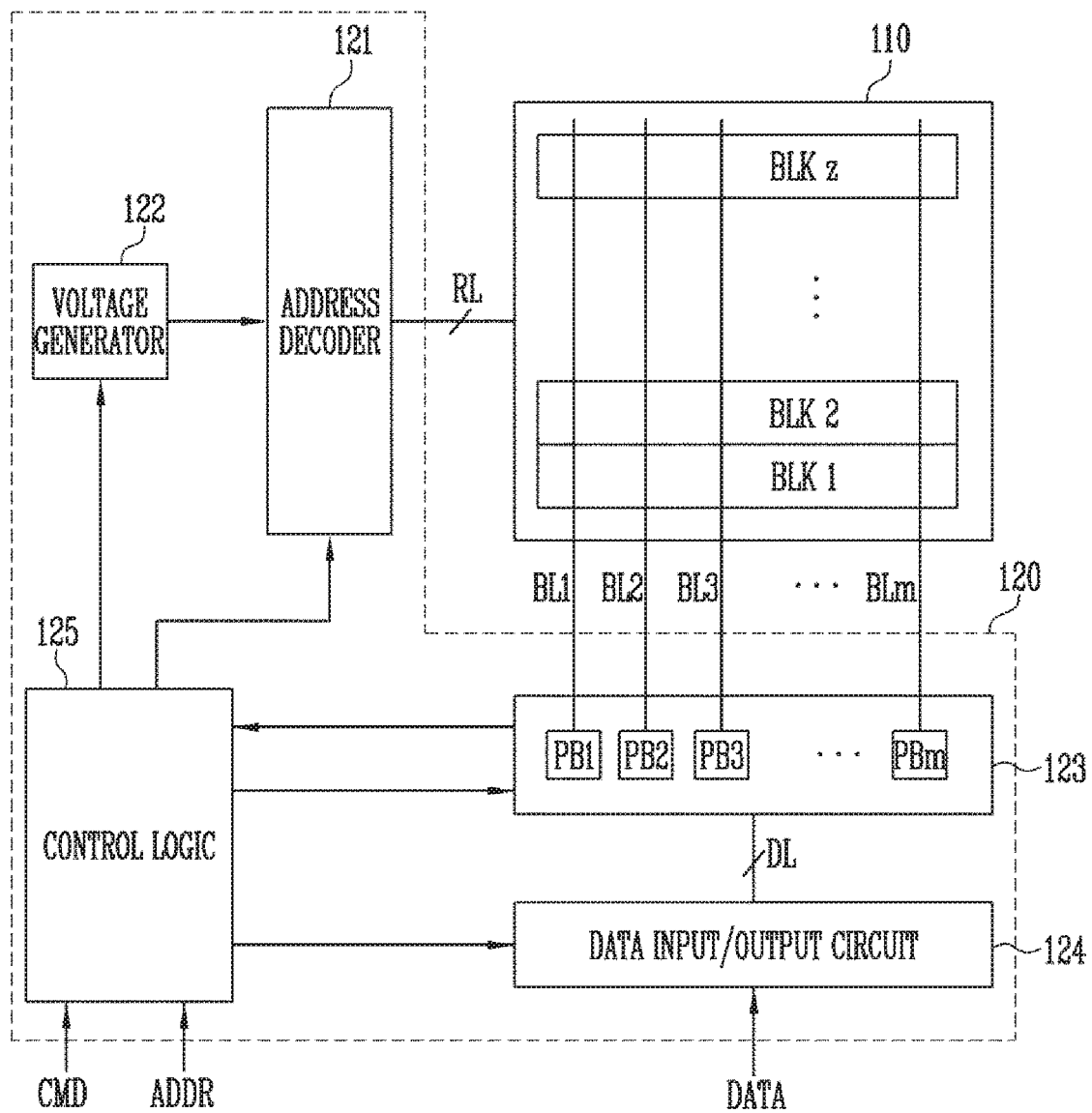
FIG. 5 is a block diagram illustrating the structure of a memory device, such as that of FIG. 1.

FIG. 5 is a block diagram illustrating structure of the memory device 100 of FIG. 1.

Referring to FIG. 5, the memory device 100 may include a memory cell array 110, a peripheral circuit 120, and control logic 125.

The memory cell array 110 may include a plurality of memory blocks BLK1 to BLKz. The memory blocks BLK1 to BLKz are connected to an address decoder 121 through row lines RL and connected to a read/write circuit 123 through bit lines BL1 to BLm. Each of the memory blocks BLK1 to BLKz may include a plurality of memory cells. In an embodiment, the plurality of memory cells may be nonvolatile memory cells.

The memory cells included in the memory cell array 110 may be divided into a plurality of blocks according to the purpose of use. System information as various setting information required to control the memory device 100 may be stored in the plurality of blocks.

Each of the first to z-th memory blocks BLK1 to BLKz includes a plurality of memory cell strings. First to m-th cell strings are respectively coupled to the first to m-th bit lines BL1 to BLm. Each of the first to m-th cell strings includes a drain select transistor, a plurality of memory cells coupled in series to each other, and a source select transistor. The drain select transistor DST is coupled to a drain select line DSL. First to n-th memory cells are respectively coupled to first to n-th word lines. The source select transistor SST is coupled to a source select line SSL. A drain of the drain select transistor DST is coupled to the corresponding bit line. The drain select transistors DST of the first to m-th cell strings are respectively coupled to the first to m-th bit lines BL1 to BLm. A source of the source select transistor SST is coupled to a common source line CSL. In an embodiment, the common source line CSL may be coupled in common to the first to z-th memory blocks BLK1 to BLKz. The drain select line DSL, the first to n-th word lines WL1 to WLn, and the source select line SSL are included in the row lines RL.

The drain select line DSL, the first to n-th word lines WL1 to WLn, and the source select line SSL are controlled by the address decoder 121. The common source line CSL is controlled by the control logic 125. The first to m-th bit lines BL1 to BLm are controlled by the read/write circuit 123.

The peripheral circuit 120 may include the address decoder 121, a voltage generator 122, the read/write circuit 123, a data input/output circuit 124, and the control logic 125.

The address decoder 121 is coupled to the memory cell array 110 through the row lines RL. The address decoder 121 may operate under control of the control logic 125. The address decoder 121 receives addresses ADDR through the control logic 125.

In an embodiment, a program operation and a read operation of the memory device 100 may be performed on a page basis.

During the program operation or the read operation, addresses ADDR received by the control logic 125 may include a block address and a row address. The address decoder 121 may decode a block address among the received addresses ADDR. The address decoder 121 may select a corresponding one of the memory blocks BLK1 to BLKz in response to the decoded block address.

The address decoder 121 may decode a row address among the received addresses ADDR. In response to the decoded row address, the address decoder 121 may apply voltages, provided from the voltage generator 122, to the row lines RL and select one word line of the selected memory block.

During an erase operation, the addresses ADDR may include a block address. The address decoder 121 may decode the block address and select one memory block in response to the decoded block address. The erase operation may be performed on the entirety or a portion of one memory block.

During a partial erase operation, the addresses ADDR may include block and row addresses. The address decoder 121 may select a corresponding one of the memory blocks BLK1 to BLKz in response to the decoded block address.

The address decoder 121 may decode row addresses among the received addresses ADDR. In response to the decoded row addresses, the address decoder 121 may apply voltages, provided from the voltage generator 122, to the row lines RL and select at least one word line of the selected memory block.

In an embodiment, the address decoder 121 may include a block decoder, a word line decoder, an address buffer, etc.

The voltage generator 122 may generate a plurality of voltages using an external supply voltage supplied to the memory device 100. The voltage generator 122 may operate under control of the control logic 125.

In an embodiment, the voltage generator 122 may generate an internal supply voltage by regulating the external supply voltage. The internal supply voltage generated from the voltage generator 122 may be used as an operating voltage of the memory device 100.

In an embodiment, the voltage generator 122 may generate a plurality of voltages using the external supply voltage or the internal supply voltage. For example, the voltage generator 122 may include a plurality of pumping capacitors for receiving the internal supply voltage, and generate a plurality of voltages by selectively activating the plurality of pumping capacitors under control of the control logic 125. The generated voltages are applied to selected word lines by the address decoder 121.

During a program operation, the voltage generator 122 may generate a program pulse having a high voltage and a pass pulse lower than the program pulse in voltage level. During a read operation, the voltage generator 122 may generate a read voltage and a pass voltage higher than the read voltage. During an erase operation, the voltage generator 122 may generate an erase voltage.

The read/write circuit 123 may include first to m-th page buffers PB1 to PBm. The first to m-th page buffers PB1 to PBm are coupled to the memory cell array 110 through the first to m-th bit lines BL1 to BLm, respectively. The first to m-th page buffers PB1 to PBm may operate under control of the control logic 125.

The first to m-th page buffers PB1 to PBm may perform data communication with the data input/output circuit 124. During a program operation, the first to m-th page buffers PB1 to PBm may receive data DATA to be stored through the data input/output circuit 124 and data lines DL.

During the program operation, the first to m-th page buffers PB1 to PBm may transmit the data DATA, received through the data input/output circuit 124, to selected memory cells through the bit lines BL1 to BLm when a program pulse is applied to a selected word line. The memory cells in the selected page are programmed based on the transmitted data DATA. A memory cell coupled to a bit line to which a program enable voltage (e.g. a ground voltage) is applied may have an increased threshold voltage. The threshold voltage of a memory cell coupled to a bit line to which a program inhibit voltage (for example, a supply voltage) is applied may be retained. During a program verify operation, the first to m-th page buffers PB1 to PBm may read page data from selected memory cells through the bit lines BL1 to BLm.

During a read operation, the read/write circuit 123 may read data DATA from the memory cells in the selected page through the bit lines BL, and output the read data DATA to the data input/output circuit 124. During an erase operation, the read/write circuit 123 may float the bit lines BL.

In an embodiment, the read/write circuit 123 may include a column select circuit.

The data input/output circuit 124 is coupled to the first to m-th page buffers PB1 to PBm through the data lines DL. The data input/output circuit 124 may operate under control of the control logic 125. During a program operation, the data input/output circuit 124 may receive data DATA to be stored from an external controller (not shown).

The control logic 125 is connected to the address decoder 121, the voltage generator 122, the read/write circuit 123, and the data input/output circuit 124. The control logic 125 may control overall operations of the memory device 100. The control logic 125 may receive a command CMD and addresses ADDR from the external controller. The control logic 125 may control the address decoder 121, the voltage generator 122, the read/write circuit 123, and the data input/output circuit 124 in response to the command CMD.

Figure 6:
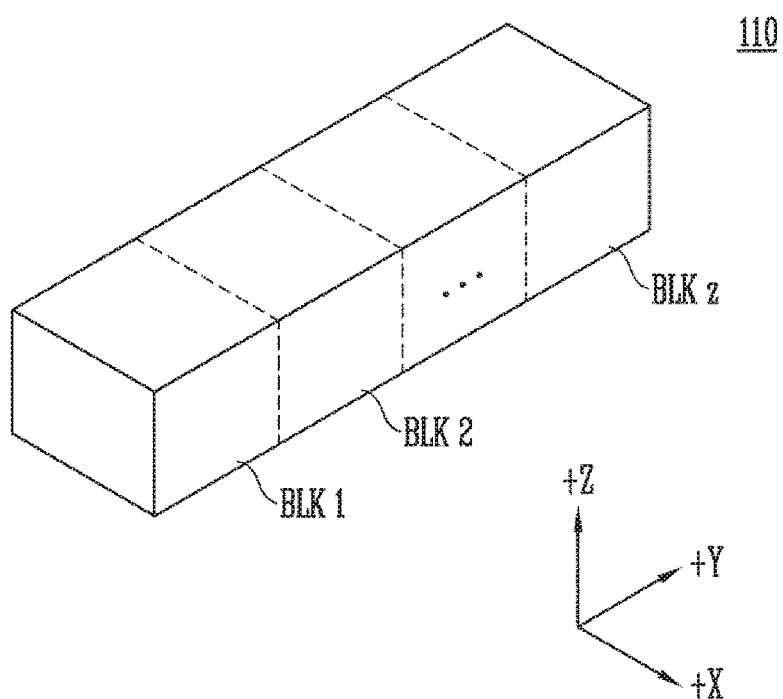
FIG. 6 is a diagram illustrating an embodiment of a memory cell array, such as that of FIG. 5.

FIG. 6 is a diagram illustrating an embodiment of the memory cell array 110 of FIG. 5.

Referring to FIG. 6, the memory cell array 110 may include a plurality of memory blocks BLK1 to BLKz. Each memory block may have a three-dimensional structure. Each memory block may include a plurality of memory cells stacked on a substrate. The memory cells are arranged in a +X direction, a +Y direction, and a +Z direction. The structure of each memory block will be described in more detail with reference to FIGS. 7 and 8.

Figure 7:
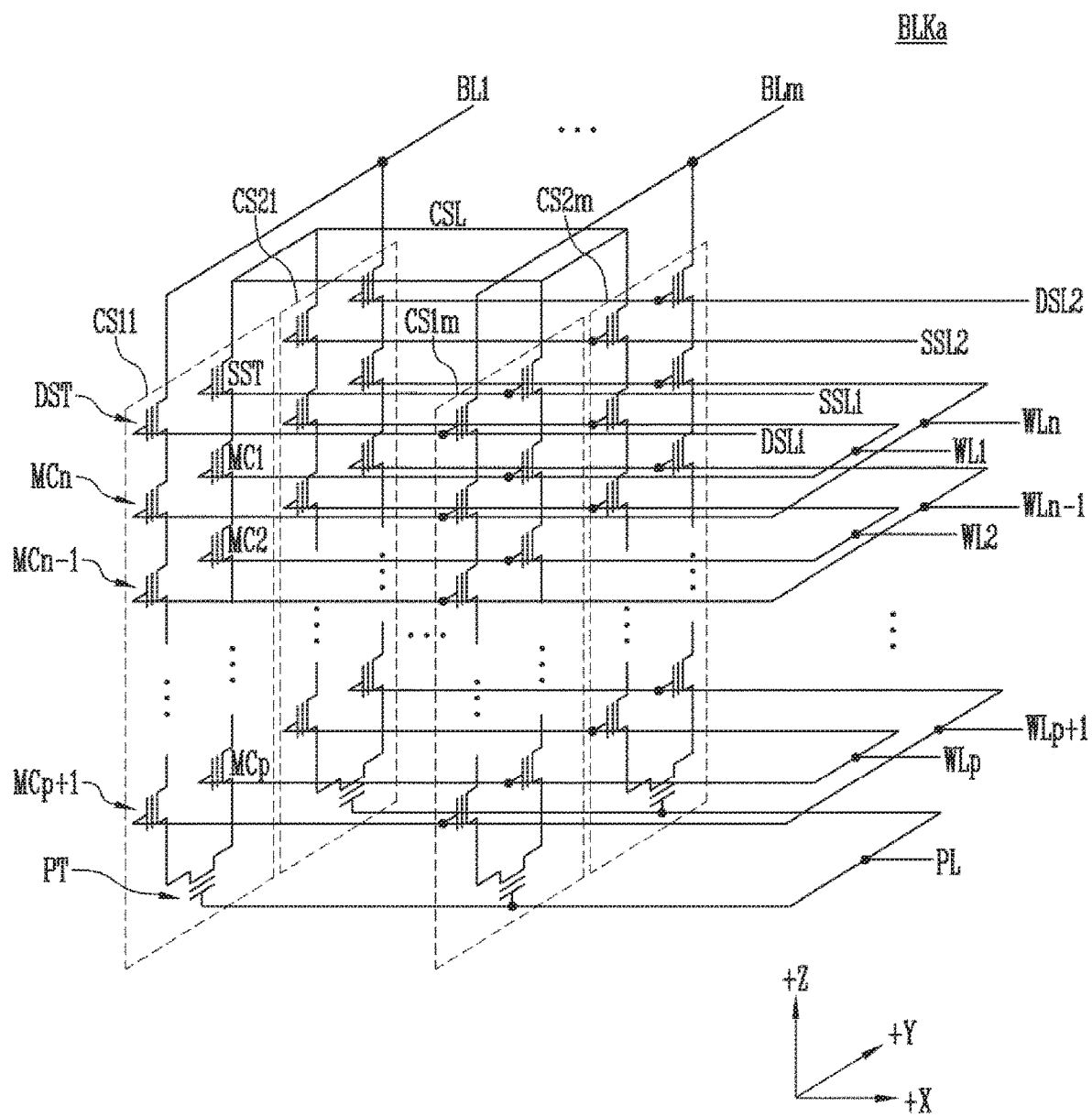
FIG. 7 is a circuit diagram illustrating any memory block BLKa of memory blocks BLK1 to BLKz of FIG. 6, in accordance with an embodiment of the present disclosure.

FIG. 7 is a circuit diagram illustrating any memory block BLKa of memory blocks BLK1 to BLKz of FIG. 6, in accordance with an embodiment of the present disclosure.

Referring to FIG. 7, the memory block BLKa may include a plurality of cell strings CS11 to CS1$m$ and CS21 to CS2$m$. In an embodiment, each of the cell strings CS11 to CS1$m$ and CS21 to CS2$m$ may be formed in a 'U' shape. In the memory block BLKa, m cell strings may be arranged in a row direction (i.e., the +X direction). In FIG. 7, two cell strings are illustrated as being arranged in a column direction (i.e., the +Y direction). However, this is for clarity of illustration; it will be understood that three or more cell strings may be arranged in the column direction.

Each of the plurality of cell strings CS11 to CS1$m$ and CS21 to CS2$m$ may include at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between the common source line CSL and the memory cells MC1 to MCp.

In an embodiment, source select transistors of cell strings arranged in the same row are coupled to a source select line extending in a row direction, and source select transistors of cell strings arranged in different rows are coupled to different source select lines. In FIG. 7, source select transistors of the cell strings CS11 to CS1$m$ in a first row are coupled to a first source select line SSL1. Source select transistors of the cell strings CS21 to CS2$m$ in a second row are coupled to a second source select line SSL2.

In an embodiment, the source select transistors of the cell strings CS11 to CS1$m$ and CS21 to CS2$m$ may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are successively arranged in a −Z direction and are coupled in series between the source select transistor SST and the pipe transistor PT. The p+1-th to n-th memory cells MCp+1 to MCn are successively arranged in the +Z direction and are coupled in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

Respective gates of the pipe transistors PT of the cell strings are coupled to a pipeline PL.

The drain select transistor DST of each cell string is coupled between the corresponding bit line and the memory cells MCp+1 to MCn. The cell strings arranged in the row direction are coupled to drain select lines extending in the row direction. Drain select transistors of the cell strings CS11 to CS1$m$ in the first row are coupled to a first drain select line DSL1. Drain select transistors of the cell strings CS21 to CS2$m$ in the second row are coupled to a second drain select line DSL2.

Cell strings arranged in the column direction may be coupled to bit lines extending in the column direction. In FIG. 7, cell strings CS11 and CS21 in a first column are coupled to a first bit line BL1. Cell strings CS1$m$ and CS2$m$ in an m-th column are coupled to an m-th bit line BLm.

Memory cells coupled to the same word line in cell strings arranged in the row direction form a single page. For example, memory cells coupled to the first word line WL1, among the cell strings CS11 to CS1$m$ in the first row, form a single page. Memory cells coupled to the first word line WL1, among the cell strings CS21 to CS2$m$ in the second row, form another single page. When any one of the drain select lines DSL1 and DSL2 is selected, corresponding cell strings arranged in the direction of a single row may be selected. When any one of the word lines WL1 to WLn is selected, a corresponding single page may be selected from among the selected cell strings.

In an embodiment, even bit lines and odd bit lines may be provided in lieu of the first to m-th bit lines BL1 to BLm. Even-number-th cell strings of the cell strings CS11 to CS1$m$ or CS21 to CS2$m$ arranged in the row direction may be coupled to respective even bit lines. Odd-number-th cell strings of the cell strings CS11 to CS1$m$ or CS21 to CS2$m$ arranged in the row direction may be coupled to respective odd bit lines.

In an embodiment, at least one of the first to n-th memory cells MC1 to MCn may be used as a dummy memory cell. For example, dummy memory cell(s) may be provided to reduce an electric field between the source select transistor SST and the memory cells MC1 to MCp. Alternatively, dummy memory cell(s) may be provided to reduce an electric field between the drain select transistor DST and the memory cells MCp+1 to MCn. As the number of dummy memory cells is increased, the reliability in operation of the memory block BLKa may be increased, while the size of the memory block BLKa may be increased. As the number of dummy memory cells is reduced, the size of the memory block BLKa may be reduced, but the reliability in operation of the memory block BLKa may be reduced.

To efficiently control the dummy memory cell(s), each of the dummy memory cells may have a required threshold voltage. Before or after an erase operation on the memory block BLKa is performed, program operations may be performed on all or some of the dummy memory cells. In the case where an erase operation is performed after a program operation has been performed, the dummy memory cells may have required threshold voltages by controlling voltages to be applied to the dummy word lines coupled to the respective dummy memory cells.

Figure 8:
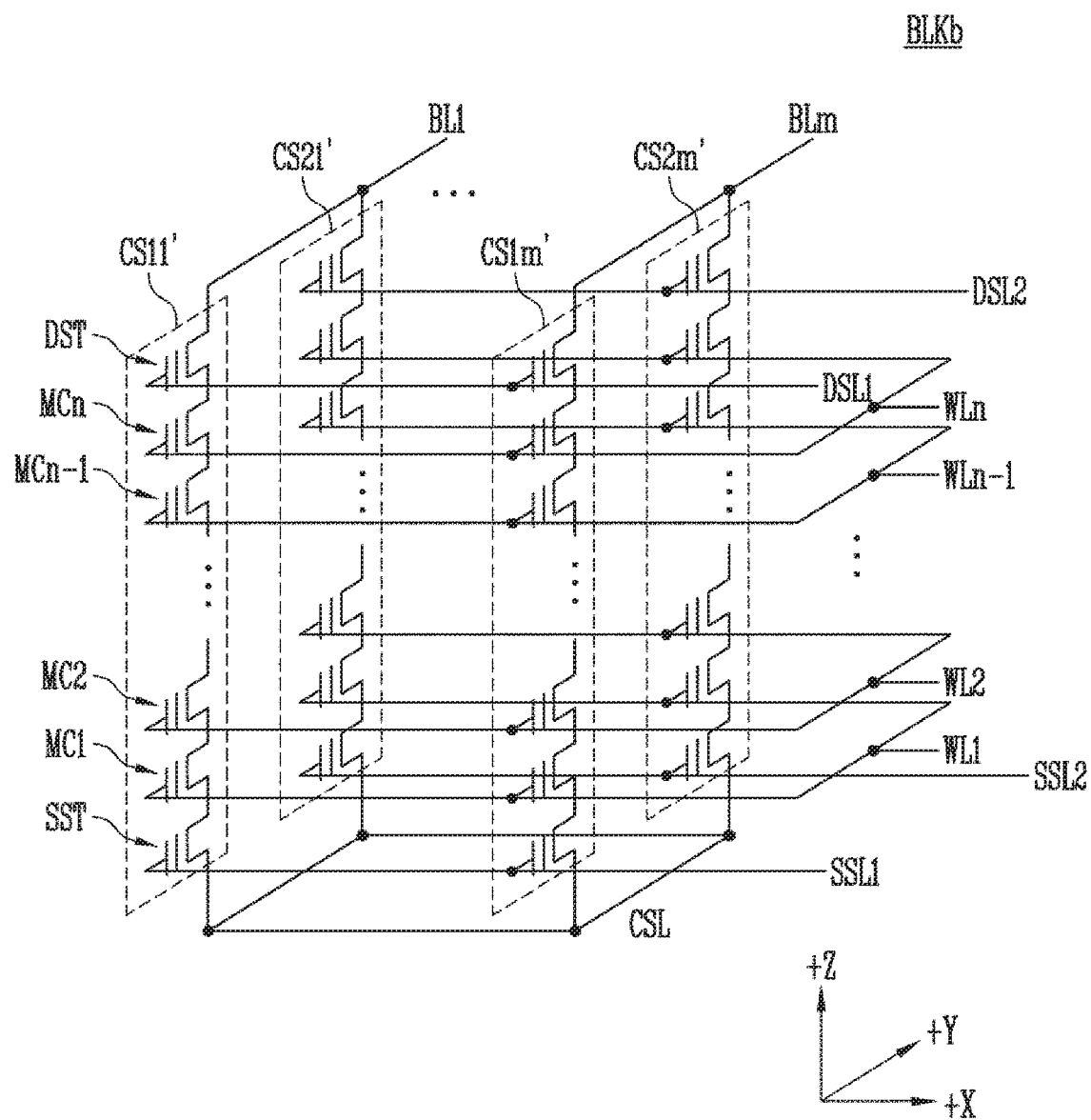
FIG. 8 is a circuit diagram illustrating any memory block BLKb of the memory blocks BLK1 to BLKz of FIG. 6, in accordance with an embodiment of the present disclosure.

FIG. 8 is a circuit diagram illustrating any memory block BLKb of the memory blocks BLK1 to BLKz of FIG. 6, in accordance with an embodiment of the present disclosure.

Referring to FIG. 8, the memory block BLKb may include a plurality of cell strings CS11' to CS1$m$' and CS21' to CS2$m$'. Each of the cell strings CS11' to CS1$m$' and CS21' to CS2$m$' extends in the +Z direction. Each of the cell strings CS11' to CS1$m$' and CS21' to CS2$m$' may include at least one source select transistor SST, first to n-th memory cells MC1 to MCn, and at least one drain select transistor DST which are stacked on a substrate (not shown) provided in a lower portion of the memory block BLKb.

The source select transistor SST of each cell string is coupled between the common source line CSL and the memory cells MC1 to MCn. The source select transistors of cell strings arranged in the same row are coupled to the same source select line. Source select transistors of the cell strings CS11' to CS1m' arranged in a first row may be coupled to a first source select line SSL1. Source select transistors of the cell strings CS21' to CS2m' arranged in a second row may be coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are coupled in series between the source select transistor SST and the drain select transistor DST. Gates of the first to n-th memory cells MC1 to MCn are respectively coupled to first to n-th word lines WL1 to WLn.

The drain select transistor DST of each cell string is coupled between the corresponding bit line and the memory cells MC1 to MCn. Drain select transistors of cell strings arranged in the row direction may be coupled to drain select lines extending in the row direction. Drain select transistors of the cell strings CS11' to CS1m' in the first row are coupled to a first drain select line DSL1. Drain select transistors of the cell strings CS21' to CS2m' in the second row may be coupled to a second drain select line DSL2.

Consequentially, the memory block BLKb of FIG. 8 may have an equivalent circuit similar to that of the memory block BLKa of FIG. 7 except that a pipe transistor PT is excluded from each cell string.

In an embodiment, even bit lines and odd bit lines may be provided in lieu of the first to m-th bit lines BL1 to BLm. Even-number-th cell strings among the cell strings CS11' to CS1m' or CS21' to CS2m' arranged in the row direction may be coupled to the respective even bit lines, and odd-number-th cell strings among the cell strings CS11' to CS1m' or CS21' to CS2m' arranged in the row direction may be coupled to the respective odd bit lines.

In an embodiment, at least one of the first to n-th memory cells MC1 to MCn may be used as a dummy memory cell. For example, dummy memory cell(s) may be provided to reduce an electric field between the source select transistor SST and the memory cells MC1 to MCn. Alternatively, dummy memory cell(s) may be provided to reduce an electric field between the drain select transistor DST and the memory cells MC1 to MCn. As the number of dummy memory cells is increased, the reliability in operation of the memory block BLKb may be increased, while the size of the memory block BLKb may be increased. As the number of dummy memory cells is reduced, the size of the memory block BLKb may be reduced, but the reliability in operation of the memory block BLKb may be reduced.

To efficiently control the dummy memory cell(s), each of the dummy memory cells may have a required threshold voltage. Before or after an erase operation on the memory block BLKb is performed, program operations may be performed on all or some of the dummy memory cells. In the case where an erase operation is performed after a program operation has been performed, the dummy memory cells may have required threshold voltages by controlling voltages to be applied to the dummy word lines coupled to the respective dummy memory cells.

Figure 9:
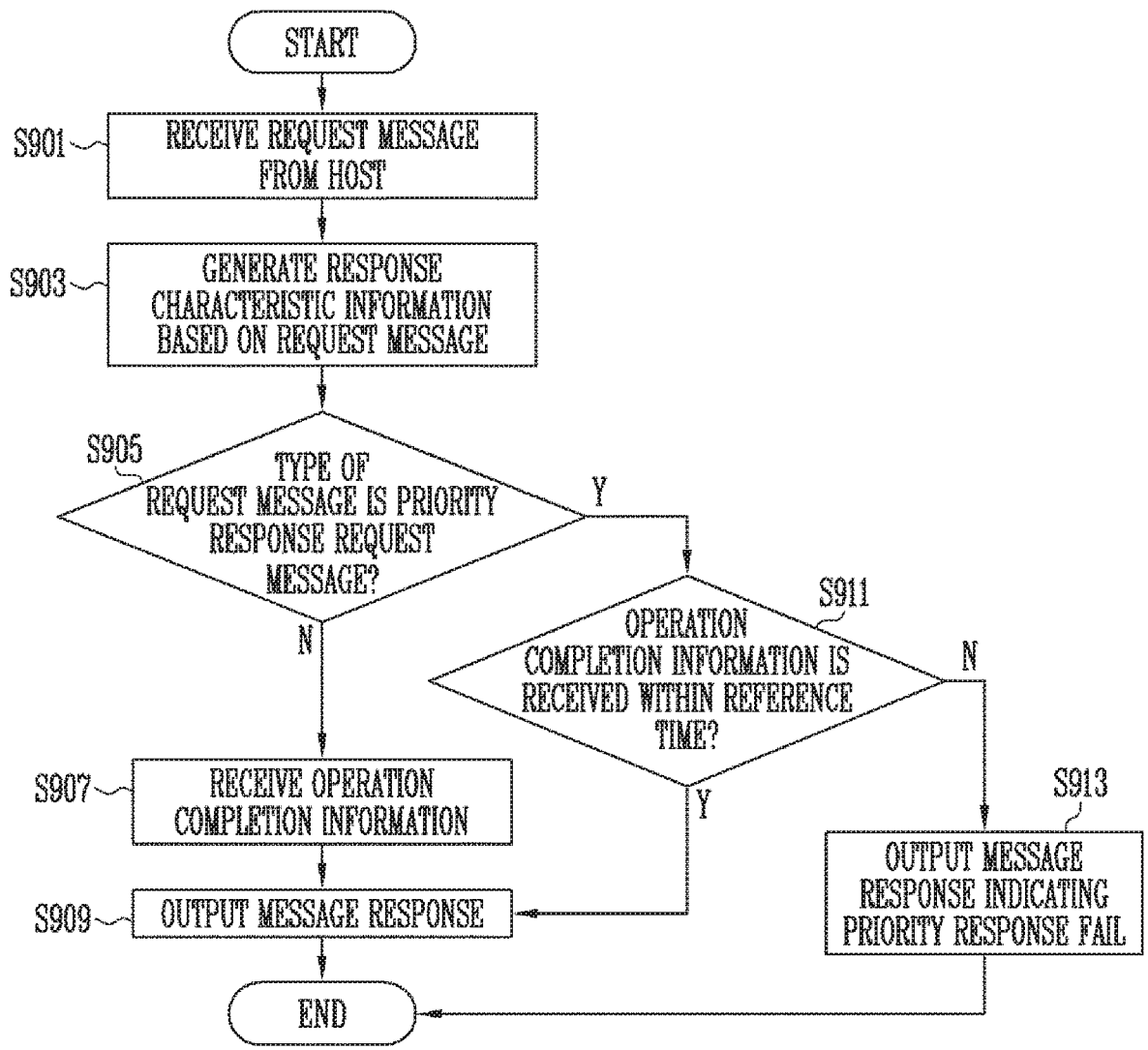
FIG. 9 is a diagram illustrating an operation of the memory controller in accordance with an embodiment of the present disclosure.

FIG. 9 is a diagram illustrating an operation of the memory controller 200 in accordance with an embodiment of the present disclosure.

Referring to FIG. 9, at step S901, the message information generator 210 may receive a request message REQ_MSG from the host 300. The request message REQ_MSG may be either a priority response request message or a normal response request message. The priority response request message may be for requesting a message response MSG_RES within a set or predetermined time. The normal response request message may be a message for requesting a message response MSG_RES to be provided to the host 300 when the memory controller 200 receives a result of a completed operation after the operation performed by the memory device 100 has been completed in response to the request message REQ_MSG. The message response MSG_RES may indicate the result of the operation performed by the memory device 100.

At step S903, the message information generator 210 may generate response characteristic information RC_INF based on the request message REQ_MSG. The response characteristic information RC_INF may include information indicating the type of request message REQ_MSG that defines response time within which a response to the request message REQ_MSG is provided to the host 300. The message information generator 210 may output the response characteristic information RC_INF to the response output controller 230.

At step S905, the response output controller 230 may determine whether the type of request message REQ_MSG is a priority response request message based on the response characteristic information RC_INF. If the type of request message REQ_MSG is not a priority response request message, i.e., if the type of request message REQ_MSG is a normal response request message, the process proceeds to step S907. If the type of request message REQ_MSG is a priority response request message, the process proceeds to step S911.

At step S907, when the type of request message REQ_MSG is a normal response request message, the response output controller 230 may receive operation completion information OC_INF from the operation controller 220. The operation completion information OC_INF may be generated based on a command response CMD_RES received from the memory device 100. The operation controller 220 may generate the operation completion information OC_INF based on operation pass/fail information in the command response CMD_RES. The operation completion information OC_INF may include a representation of the operation pass/fail information in the command response CMD_RES. That is, the operation completion information OC_INF may indicate whether the operation performed by the memory device 100 based on the command CMD has passed or failed.

At step S909, the response output controller 230 may output a message response MSG_RES when the operation completion information OC_INF is received. In detail, the first message response output component 231 may output a first message response MSG1_RES when the operation completion information OC_INF is received from the operation controller 220.

At step S911, it may be determined whether the operation controller 220 has received the operation completion information OC_INF within the reference time. In other words, when the request message REQ_MSG is a priority response request message, it may be determined whether the operation controller 220 has received the operation completion information OC_INF within the reference time. If the operation controller 220 has received the operation completion information OC_INF within the reference time, the process proceeds to step S909. If the operation controller 220 has not received the operation completion information OC_INF within the reference time, the process proceeds to step S913.

At step S913, the response output controller 230 may output a message response MSG_RES indicating priority response fail after the reference time has passed. In detail, if the request message REQ_MSG is a priority response request message and the operation completion information is not received within the reference time, the first message response output component 231 remains on standby, but the second message response output component 232 may output a second message response MSG2_RES indicating the priority response fail when the reference time has elapsed. In other words, the second message response output component 232 may output the message response MSG_RES when the request message REQ_MSG is a priority response request message and the operation completion information OC_INF has not been received within the reference time. The second message response MSG2_RES may indicate that an operation corresponding to the priority response request message is being performed.

Figure 10:
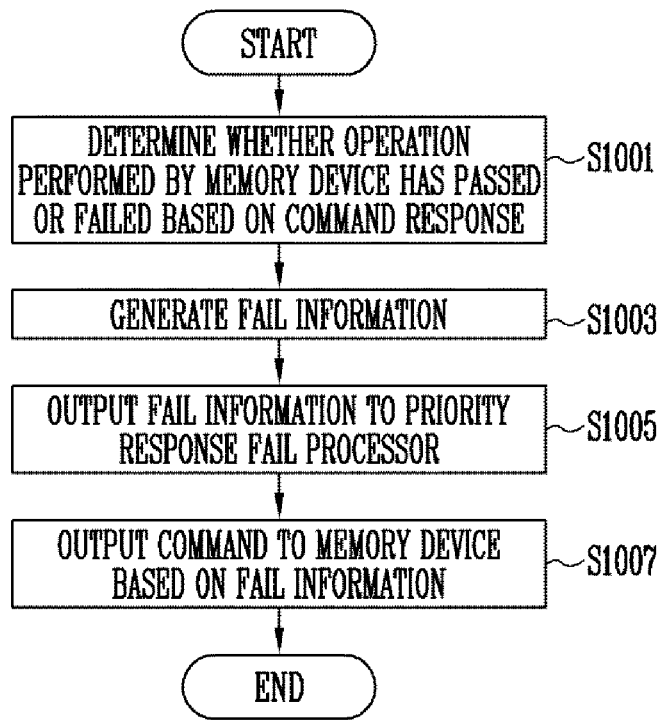
FIG. 10 is a diagram illustrating the operation of the memory controller in accordance with an embodiment of the present disclosure.

FIG. 10 is a diagram illustrating the operation of the memory controller 200 in accordance with an embodiment of the present disclosure.

Referring to FIG. 10, FIG. 10 illustrates the operation of the memory controller 200 when a command response CMD_RES for outputting the operation completion information OC_INF of FIG. 9 indicates a failure of the operation. Moreover, FIG. 10 illustrates the operation of the memory controller 200 regardless of whether the request message REQ_MSG from the host is a normal response request message or a priority response request message.

Referring to FIG. 10, at step S1001, the operation controller 220 may determine whether the operation has passed or failed based on the command response CMD_RES. The command response CMD_RES may indicate a result of performing, by the memory device 100, the operation corresponding to the command CMD. In other words, the command response CMD_RES may indicate a result of a program operation, a read operation, or an erase operation performed by the memory device 100. Therefore, the operation controller 220 may determine whether the program operation, the read operation, or the erase operation passed or failed, based on the command response CMD_RES.

At step S1003, the command response receiver 221 may generate fail information FAIL_INF. In detail, in the case where the operation performed by the memory device 100 has failed, the command response receiver 221 may generate and output fail information FAIL_INF including information about fail of the operation. The fail information FAIL_INF may include information for an error correction operation. In other words, the operation performed by the memory device 100 may have failed before an error correction operation is performed.

At step S1005, the command response receiver 221 may output the fail information FAIL_INF to the priority response fail processor 222. The fail information FAIL_INF may include information for reperforming the failed operation. In other words, the fail information FAIL_INF may include information for performing, by the memory device 100, the error correction operation.

At step S1007, the priority response fail processor 222 may generate a command CMD for reperforming the failed operation after having received the fail information FAIL_INF from the command response receiver 221.

In detail, in the case where the failed operation is a write operation, the priority response fail processor 222 may generate a command CMD for reperforming the write operation on another physical address in a memory cell array included in the memory device 100, and output the command CMD to the memory device 100. In the case where the failed operation is a read operation, the priority response fail processor 222 may generate a command CMD for reperforming the read operation at a read voltage level different from that of the previously failed read operation, and output the command CMD to the memory device 100. The memory device 100 may perform a read operation again with the different read voltage level in response to the command CMD provided from the priority response fail processor 222.

Figure 11:
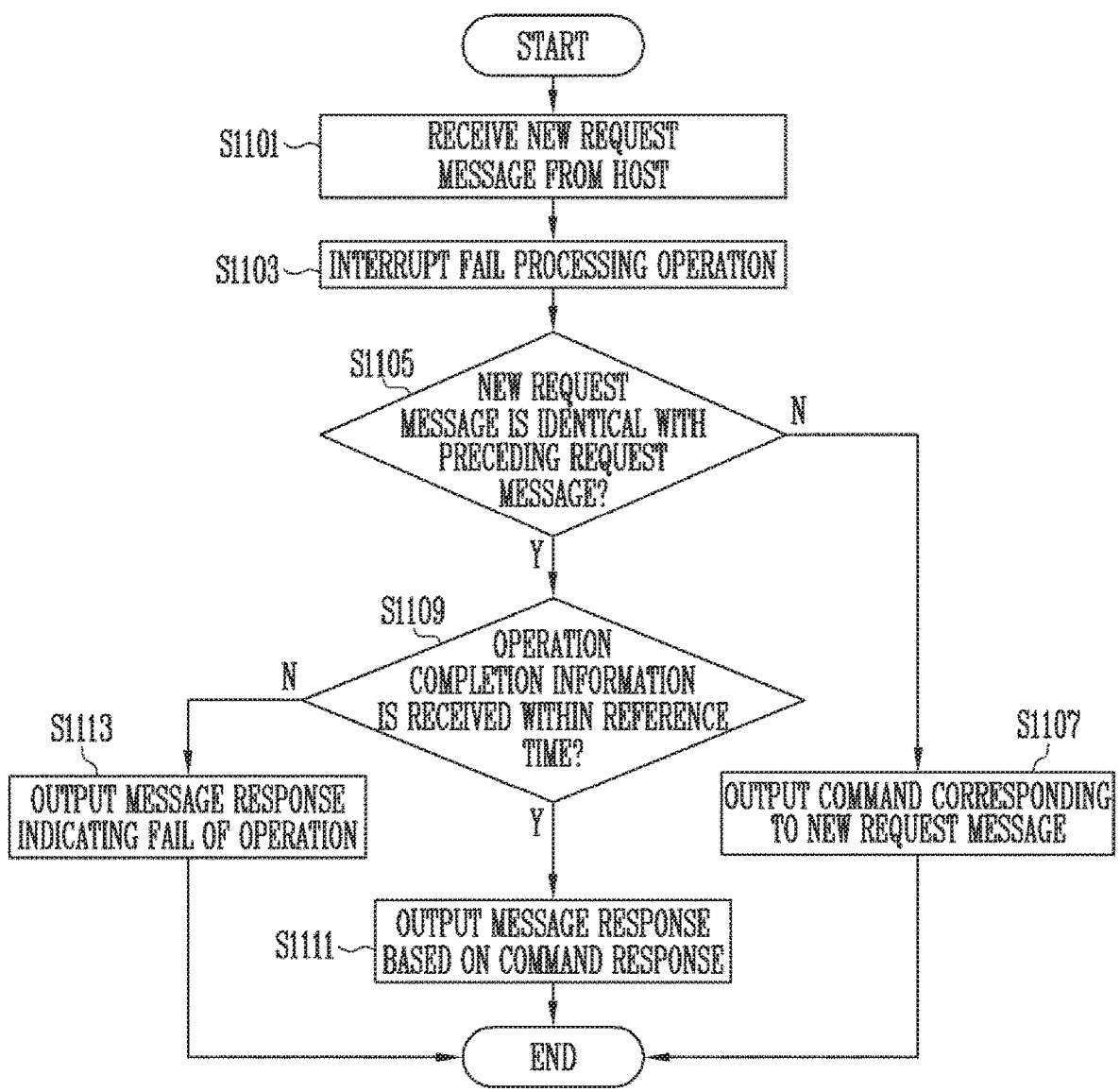
FIG. 11 is a diagram illustrating the operation of the memory controller in accordance with an embodiment of the present disclosure.

FIG. 11 is a diagram illustrating the operation of the memory controller 200 in accordance with an embodiment of the present disclosure.

FIG. 11 illustrates an operating sequence after the priority response fail processor 222 has provided a command CMD for reperforming the previously failed operation to the memory device 100.

At step S1101, the message information generator 210 may receive a request message REQ_MSG from the host 300. The received request message REQ_MSG may be a new request message. The new request message may be identical with the preceding request message, or a request message for a new operation to be performed by the memory device 100. The message information generator 210 may provide the new request message to the operation controller 220.

At step S1103, the operation controller 220 may interrupt a fail processing operation, S1001 to S1007 of FIG. 10. In detail, if the operation controller 220 receives the new request message from the host 300, the operation controller 220 may not generate a command CMD for error correction, etc. of the previously failed operation. Therefore, the fail processing operation may be interrupted. That is, the fail processing operation is reperformed internally by memory controller 220 until the new request message from the host is received, but it is no longer reperformed after receiving the new request message.

At step S1105, it may be determined whether the new request message received from the host 300 is identical with the previous request message. In other words, the new request message may be a request message for reperforming the previously failed operation, or a request message for performing an operation different from the previously failed operation. That is, the new request message may be received from the host when the host requests for reperforming the previously failed operation or performing an operation different from the previously failed operation. If the new request message is identical with the previous request message, the process proceeds to step S1109. If the new request message is not identical with the previous request message, the process proceeds to step S1107.

At step S1107, the operation controller 220 may output a command CMD corresponding to the new request message REQ_MSG. In detail, the operation controller 220 may interrupt operations for reperforming the failed operation, and output a command CMD for performing a new operation. The memory device 100 may perform an operation corresponding to the command CMD received from the operation controller 220.

At step S1109, it may be determined whether the response output controller 230 has received the operation completion information OC_INF within a reference time, which may be preset. In the case where the new request message received from the host 300 is identical with the previous request message, the new request message may be an additional result request message for requesting an additional result for the previously failed operation. The additional result request message may be a priority response request message. Therefore, the response output controller 230 may determine output of a message response MSG_RES based on whether the operation completion information OC_INF has been received within the reference time. In the case where the response output controller 230 has received the operation completion information OC_INF within the reference time, the process proceeds to step S1111. In the case where the response output controller 230 has not received the operation completion information OC_INF within the reference time, the process proceeds to step S1113.

At step S1111, the response output controller 230 may output a message response MSG_RES to the host 300 based on information included in the operation completion information OC_INF. If the response characteristic information RC_INF is received from the message information generator 210, the response output controller 230 may output the message response MSG_RES based on the operation completion information OC_INF. In the case where the operation completion information OC_INF includes information indicating that the performed operation has completed and passed, the response output controller 230 may output a message response MSG_RES indicating that the operation has passed. In the case where the operation completion information OC_INF includes information indicating that the performed operation has failed, the response output controller 230 may output a message response MSG_RES indicating that the operation has failed.

At step S1113, the response output controller 230 may output a message response MSG_RES indicating that the operation has failed. That is, the message response MSG_RES of step S1113 may be identical a message response MSG_RES of step S913 indicating priority response fail of FIG. 9. In detail, the case where the response output controller 230 has not received the operation completion information OC_INF within the reference time may be where the memory device 100 is reperforming the previously failed operation. The case where the response output controller 230 has not received the operation completion information OC_INF within the reference time may be the case where the operation has not passed. Therefore, the response output controller 230 may output a message response MSG_RES indicating that the operation has failed to the host 300.

Figure 12:
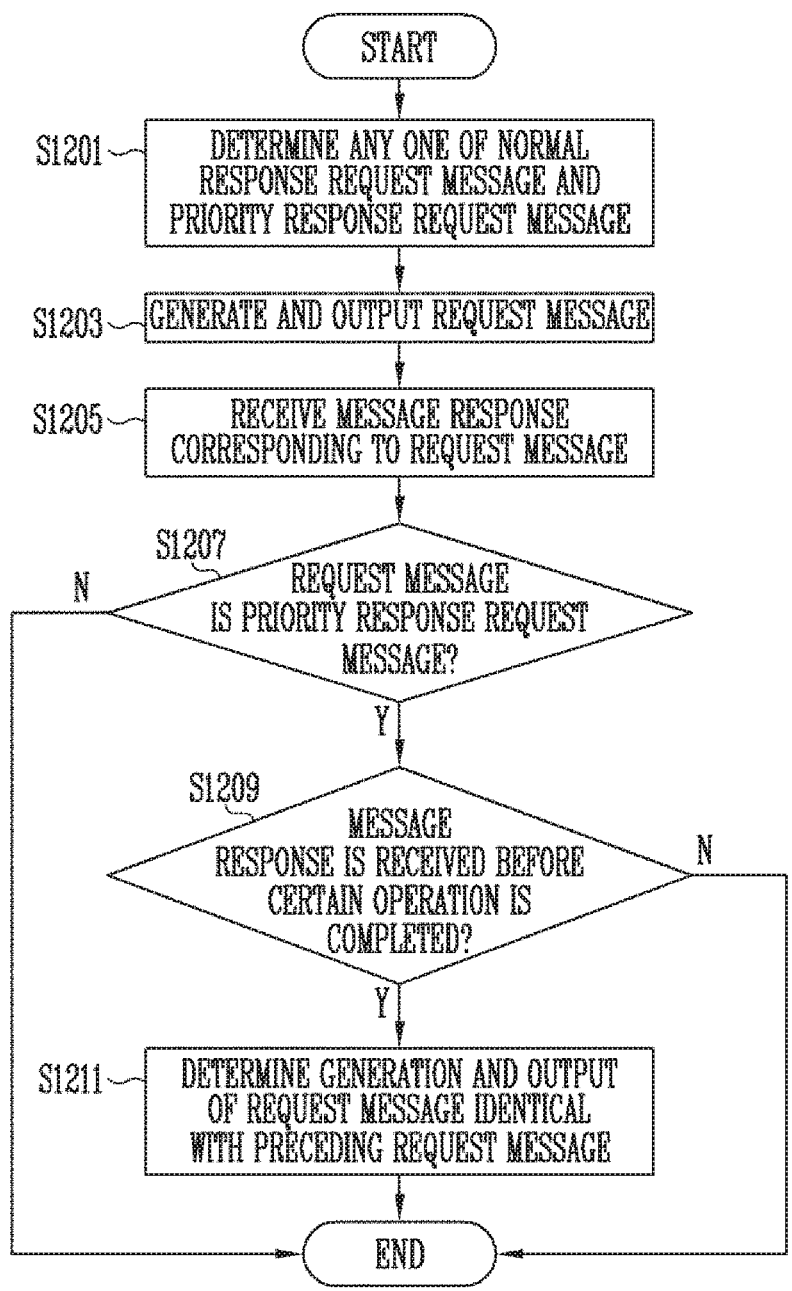
FIG. 12 is a diagram illustrating the operation of a host in accordance with an embodiment of the present disclosure.

FIG. 12 is a diagram illustrating an operation of the host 300 in accordance with an embodiment of the present disclosure.

Referring to FIG. 12, at step S1201, the host 300 may determine a request message to be either a normal response request message or a priority response request message. In other words, the host 300 may determine the type of the request message as either a normal response request message or a priority response request message based on a response time within which a message response MSG_RES to the request message REQ_MSG is to be provided to the host 300.

At step S1203, the host 300 may generate and output the request message REQ_MSG determined based on the response time within which a message response MSG_RES to the request message REQ_MSG is desired to be provided to the host 300. In detail, the host 300 may output the generated and output request message REQ_MSG to the message information generator 210 and the operation controller 220. The message information generator 210 and the operation controller 220 may perform an operation corresponding to the request message REQ_MSG.

At step S1205, the host 300 may receive the message response MSG_RES corresponding to the request message REG_MSG. The message response MSG_RES may indicate a result of the operation performed by the memory device 100 in response to the provided request message REQ_MSG. The message response MSG_RES may indicate that the operation performed by the memory device 100 has passed or failed, based on the operation completion information OC_INF provided from the operation controller 220. In other words, the operation completion information OC_INF may include success or failure indication information of the command response CMD_RES.

At step S1207, the host 300 may determine, after having received the message response MSG_RES, whether the request message REQ_MSG output to the message information generator 210 and the operation controller 220 at the step S1203 is a priority response request message. If the request message REQ_MSG is a priority response request message, the process proceeds to step S1209.

At step S1209, in the case where the request message REQ_MSG is a priority response request message, the host 300 may determine whether the message response MSG_RES has been received before a specific operation performed by the memory device 100 is completed. In other words, it may be determined whether the message response MSG_RES indicates a priority response fail. The message response MSG_RES that indicates a priority response fail may be a response which is output when the operation completion information OC_INF is not transmitted to the response output controller 230 within a reference time. The message response MSG_RES that indicates the priority response fail may indicate that the memory device 100 is performing the operation in response to the request message REQ_MSG. In the case where the host 300 has received the message response MSG_RES before the specific operation is completed, the process proceeds to step S1211.

At step S1211, the host 300 may determine generation and output of a request message identical with the preceding request message. After the response output controller 230 has output the message response MSG_RES that indicates the priority response fail, the host 300 may generate and output a new request message. The new request message may be an additional result request message which requests an additional result for the previously failed operation, or may be a request message for a new operation to be performed on the memory device. The new request message may be a request message equal to or different from the preceding request message. Therefore, if the host 300 determines generation and output of the same request message as the preceding request message, the memory controller 200 and the memory device 100 may perform an operation equal to the operation corresponding to the preceding request message.

Figure 13:
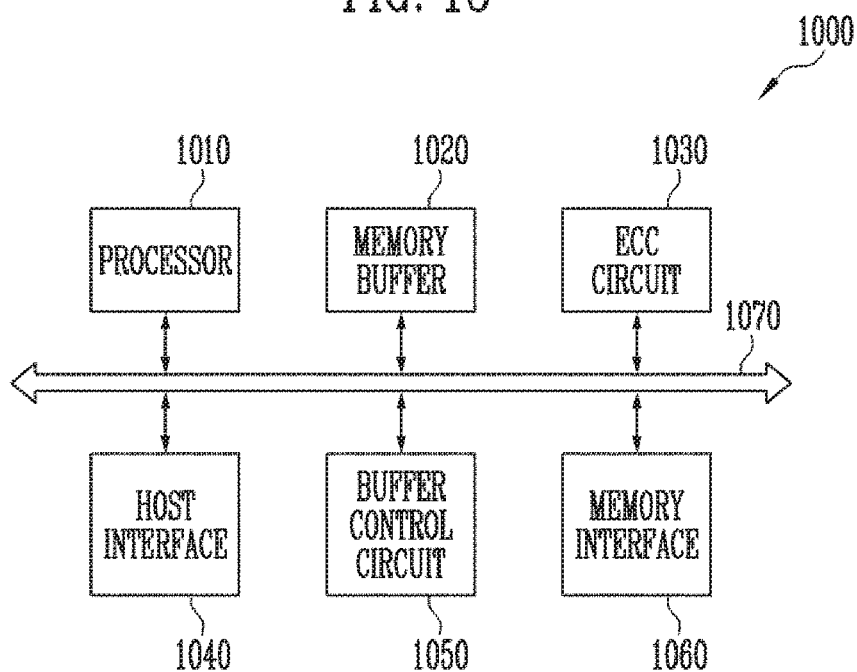
FIG. 13 is a diagram illustrating an embodiment of a memory controller, such as that of FIG. 1.

FIG. 13 is a diagram illustrating an embodiment of the memory controller of FIG. 1.

A memory controller 1000 is coupled to a host and a memory device. In response to a request from the host, the memory controller 1000 may access the memory device. For example, the memory controller 1000 may control a write operation, a read operation, an erase operation, and a background operation of the memory device. The memory controller 1000 may provide an interface between the memory device and the host. The memory controller 1000 may drive firmware for controlling the memory device.

Referring to FIG. 13, a memory controller 1000 may include a processor 1010, a memory buffer 1020, an error correction code (ECC) circuit 1030, a host Interface 1040, a buffer control circuit 1050, a memory interface 1060, and a bus 1070.

The bus 1070 may provide a channel between the components of the memory controller 1000.

The processor 1010 may control the overall operation of the memory controller 1000 and perform a logical operation. The processor 1010 may communicate with the external host through the host interface 1040, and communicate with the memory device through the memory interface 1060. In addition, the processor 1010 may communicate with the memory buffer 1020 through the buffer control circuit 1050. The processor 1010 may control the operation of the storage device using the memory buffer 1020 as an operating memory, a cache memory, or a buffer memory.

The processor 1010 may perform the function of a flash translation layer (FTL). The processor 1010 may translate a logical block address (LBA), provided by the host, into a physical block address (PBA) through the FTL. The FTL may receive the LBA and translate the LBA into the PBA using a mapping table. An address mapping method using the FTL may be modified in various ways depending on the unit of mapping. Representative address mapping methods may include a page mapping method, a block mapping method, and a hybrid mapping method.

The processor 1010 may randomize data received from the host. For example, the processor 1010 may use a randomizing seed to randomize data received from the host. Randomized data may be provided to the memory device as data to be stored, and may be programmed to the memory cell array.

During a read operation, the processor 1010 may derandomize data received from the memory device 100. For example, the processor 1010 may use a derandomizing seed to derandomize data received from the memory device. Derandomized data may be output to the host.

In an embodiment, the processor 1010 may drive software or firmware to perform the randomizing operation or the derandomizing operation.

The memory buffer 1020 may be used as an operating memory, a cache memory, or a buffer memory of the processor 1010. The memory buffer 1020 may store codes and commands to be executed by the processor 1010. The memory buffer 1020 may store data to be processed by the processor 1010. The memory buffer 1020 may include a static RAM (SRAM) or a dynamic RAM (DRAM).

The ECC circuit 1030 may perform error correction. The ECC circuit 1030 may perform an ECC encoding operation based on data to be written to the memory device 100 through the memory interface 1060. ECC encoded data may be transmitted to the memory device through the memory interface 1060. The ECC circuit 1030 may perform an ECC decoding operation on data received from the memory device through the memory interface 1060. For example, the ECC circuit 1030 may be included in the memory interface 1060 as a component of the memory interface 1060.

The host interface 1040 may communicate with the external host under control of the processor 1010. The host interface 1040 may perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), multiMedia card (MMC), an embedded MMC (eMMC), a dual in-line memory module (DIMM), a registered DIMM (RDIMM), and a load reduced DIMM (LRDIMM) communication methods.

The buffer control circuit 1050 may control the memory buffer 1020 under control of the processor 1010.

The memory interface 1060 may communicate with the memory device 100 under control of the processor 1010. The memory interface 1060 may communicate a command, an address, and data with the memory device through the channel.

In an embodiment, the memory controller 1000 may include neither the memory buffer 1020 nor the buffer control circuit 1050. Either or both of these components may be provided separately or one or both of their functions may be distributed to other components of the memory controller 1000.

For example, the processor 1010 may use codes to control the operation of the memory controller 1000. The processor 1010 may load codes from a nonvolatile memory device (e.g., a read only memory) provided in the memory controller 1000. Alternatively, the processor 1010 may load codes from the memory device through the memory interface 1060.

For example, the bus 1070 of the memory controller 1000 may be divided into a control bus and a data bus. The data bus may transmit data in the memory controller 1000. The control bus may transmit control information such as a command and an address in the memory controller 1000. The data bus and the control bus may be separated from each other and may neither interfere with each other nor affect each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 14:
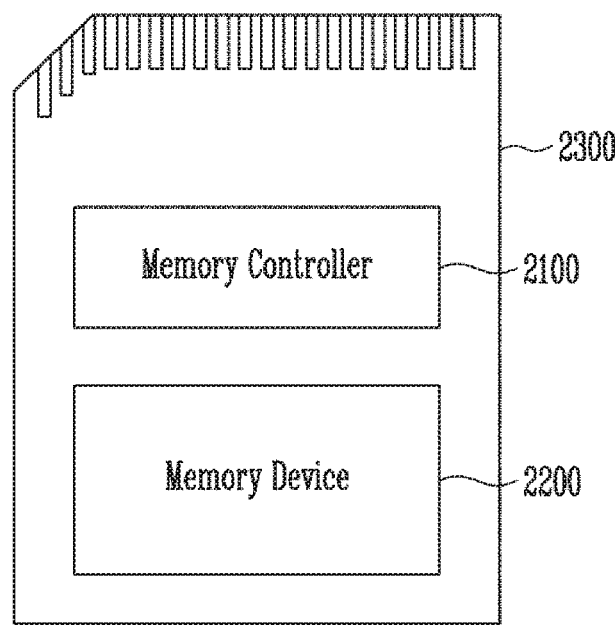
FIG. 14 is a block diagram illustrating a memory card system to which a storage device in accordance with an embodiment of the present disclosure is applied.

FIG. 14 is a block diagram illustrating a memory card system to which the storage device in accordance with an embodiment of the present disclosure is applied.

Referring FIG. 14, the memory card system 2000 may include a memory controller 2100, a memory device 2200 and a connector 2300.

The memory controller 2100 is coupled to the memory device 2200. The memory controller 2100 may access the memory device 2200. For example, the memory controller 2100 may control a read operation, a write operation, an erase operation, and a background operation of the memory device 2200. The memory controller 2100 may provide an interface between the memory device 2200 and the host. The memory controller 2100 may drive firmware for controlling the memory device 2200. The memory device 2200 may be embodied in the same manner as that of the memory device 100 described with reference to FIG. 5.

In an embodiment, the memory controller 2100 may include components such as a random access memory (RAM), a processor, a host interface, and a memory interface, and an ECC circuit.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), Wi-Fi, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-transfer torque magnetic RAM (STT-MRAM).

In an embodiment, the memory controller 2100 and the memory device 2200 may be integrated into a single semiconductor device to form a memory card such as a personal computer memory card international association (PCM-CIA), a compact flash card (CF), a smart media card (SM or SMC), a memory stick, a multimedia card (MMC, RS-MMC, or MMCmicro), a SD card (SD, miniSD, microSD, or SDHC), or a universal flash storage (UFS).

Figure 15:
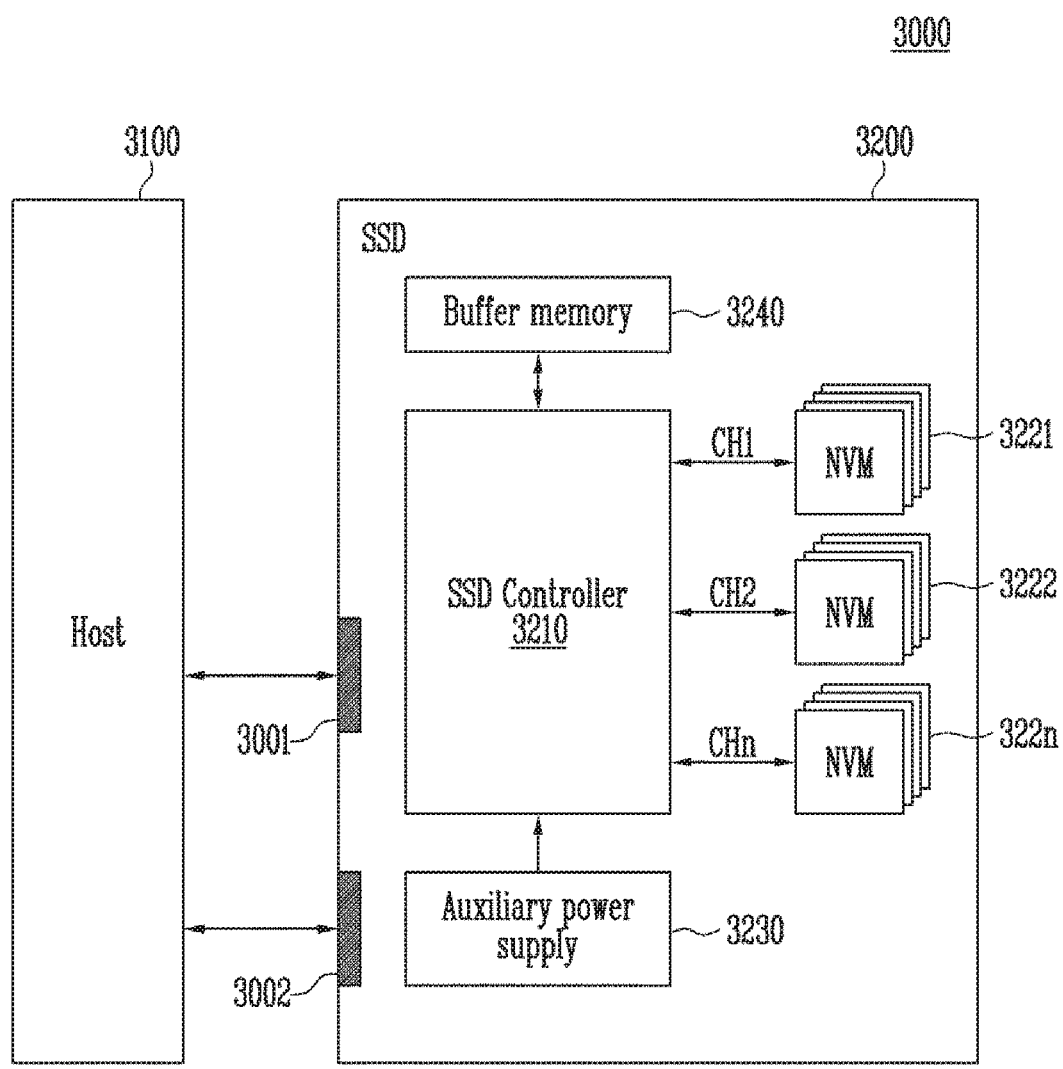
FIG. 15 is a block diagram illustrating a solid state drive (SSD) system to which the storage device in accordance with an embodiment of the present disclosure is applied.

FIG. 15 is a block diagram illustrating a solid state drive (SSD) system 3000 to which the storage device in accordance with an embodiment of the present disclosure is applied.

Referring to FIG. 15, the SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may perform the function of the memory controller 200, described above with reference to FIG. 1.

The SSD controller 3210 may control the plurality of flash memories 3221 to 322n in response to the signals SIG received from the host 3100. In an embodiment, the signals SIG may be based on an interface between the host 3100 and the SSD 3200. For example, the signals SIG may be defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The auxiliary power supply 3230 may be coupled to the host 3100 through the power connector 3002. The auxiliary power supply 3230 may be supplied with power PWR from the host 3100, and may be charged by the power PWR. The auxiliary power supply 3230 may supply the power of the SSD 3200 when the supply of power from the host 3100 is not smoothly performed. In an embodiment, the auxiliary power supply 3230 may be disposed within the SSD 3200 or externally to the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322n or may temporarily store metadata (e.g., a mapping table) of the flash memories 3221 to 322n. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

FIG. 16 is a block diagram illustrating a user system 4000 to which the storage device in accordance with an embodiment of the present disclosure is applied.

Referring to FIG. 16, the user system 4000 may include an application processor 4100, a memory module 4200, a network module 4300, a storage module 4400, and a user interface 4500.

The application processor 4100 may run components included in the user system 4000, an operating system (OS) or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory, or a cache memory of the user system 4000. The memory module 4200 may include a volatile RAM such as a DRAM, an SDRAM, a DDR SDRAM, a DDR2 SDRAM, a DDR3 SDRAM, an LPDDR SDARM, and an LPDDR3 SDRAM, or a nonvolatile RAM such as a PRAM, a ReRAM, an MRAM, and an FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as code division multiple access (CDMA), global system for mobile communication (GSM), wideband CDMA (WCDMA), CDMA-2000, time division multiple access (TDMA), long term evolution (LTE), WiMAX, WLAN, UWB, Bluetooth, or Wi-Fi communication. In an embodiment, the network module 4300 may be included in the application processor 4100.

The storage module 4400 may store data therein. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a phase-change RAM (PRAM), a magnetic RAM (MRAM), a resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, and each of the plurality of nonvolatile memory devices may be operated in the same manner as that of the memory device 100, described above with reference to FIGS. 5 to 8. The storage module 4400 may be operated in the same manner as that of the storage device 50, described above with reference to FIG. 1.

The user interface 4500 may include interfaces for inputting data or instructions to the application processor 4100 or outputting data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a liquid crystal display (LCD), an organic light emitting diode (OLED) display device, an active matrix OLED (AMOLED) display device, an LED, a speaker, and a monitor.

Various embodiments of the present disclosure provide a memory controller configured to output a response at a defined time, and a method of operating the memory controller.

Although embodiments of the present disclosure have been disclosed, those skilled in the art will appreciate in light of the present disclosure that various modifications, additions and substitutions are possible, without departing from the scope and spirit of the present disclosure.

Therefore, the scope of the present disclosure is defined by the appended claims and equivalents thereof rather than by the description preceding them.

In the above-discussed embodiments, all steps may be selectively performed or skipped. In addition, the steps in each embodiment may not be always performed in regular order. Furthermore, the embodiments disclosed in the present specification and the drawings aim to help those skilled in this art more clearly understand the present disclosure rather than aiming to limit the bounds of the present invention. In other words, those skilled in the art will be able to easily understand that various modifications are possible based on the technical scope of the present disclosure.

Although specific terms or words are used in the description, they are not intended to limit the scope of the present invention. It should be understood that many variations and modifications of the basic inventive concept described herein will still fall within the spirit and scope of the present disclosure as defined in the appended claims and their equivalents.

What is claimed is:

1. A memory controller configured to control a memory device including a memory cell array, the memory controller comprising:
   a message information generator configured to receive a first request message from a host, and generate and output response characteristic information indicating a type of the first request message that defines a response time within which a message response to the first request message is provided to the host; and
   a response output controller configured to determine, based on the response characteristic information and whether first operation completion information corresponding to the first request message is received within a reference time, a time at which the message response corresponding to the first request message is output to the host,
   wherein the first request message is a normal response request message or a priority response request message,
   wherein, when the first request message is the normal response request message, the response output controller outputs the message response when the first operation completion information is received, and
   wherein, when the first request message is the priority response request message, the response output controller outputs the message response based on whether the first operation completion information has been received within the reference time defined by the priority response request message.

2. The memory controller according to claim 1, further comprising an operation controller configured to generate a first command corresponding to the first request message and output the first command to the memory device, and receive a first command response corresponding to the first command from the memory device and generate and output the first operation completion information based on the first command response.

3. The memory controller according to claim 2, wherein the operation controller generates the first operation completion information including success or failure indication information of the first command response.

4. The memory controller according to claim 1, wherein the response output controller comprises:
   a first message response output component configured to output a first message response corresponding to the first operation completion information; and
   a second message response output component configured to output a second message response corresponding to the first operation completion information and the reference time.

5. The memory controller according to claim 4, wherein the first message response output component outputs the first message response when the first request message is the normal response request message and the first operation completion information is received, or when the first request message is the priority response request message and the first operation completion information is received within the reference time.

6. The memory controller according to claim 4, wherein the second message response output component outputs, when the first request message is the priority response request message and the first operation completion information is not received within the reference time, the second message response including a priority response fail indicating that an operation corresponding to the first request message is being performed after the reference time has elapsed.

7. The memory controller according to claim 4, wherein the operation controller receives a second request message from the host after the response output controller outputs the second message response.

8. The memory controller according to claim 7, wherein the operation controller generates a second command corresponding to the second request message and outputs the second command to the memory device, and receives a second command response corresponding to the second command from the memory device and generates and outputs second operation completion information based on the second command response.

9. The memory controller according to claim 8, wherein, when the second request message is identical with the first request message, the second command is identical with the first command and the operation controller generates the second operation completion information based on the second command response corresponding to the second command.

10. The memory controller according to claim 8, wherein, when the second request message is different from the first request message, the operation controller generates the second command that differs from the first command and corresponds to the second request message and outputs the second command to the memory device.

11. The memory controller according to claim 9, wherein, when the first request message is a write request message, the operation controller changes a physical address corresponding to the first command and outputs the first command with the changed physical address to the memory device so that the first command is performed on the changed physical address in the memory cell array.

12. The memory controller according to claim 9, wherein, when the first request message is a read request message, the operation controller changes a read voltage level corresponding to the first command and outputs the first command with the changed read voltage level to the memory device so that the first command is performed at the changed read voltage level.

13. A memory controller configured to control a memory device including a memory cell array, the memory controller comprising:
- a message information generator configured to receive a request message from a host, and generate and output response characteristic information including information about whether the request message is a priority response request message or a normal response request message; and
- a response output controller configured to output, when the response characteristic information includes information about the priority response request message, a message response to the host before the memory device reperforms a failed operation, the message response indicating that the operation has failed according to whether operation completion information corresponding to the request message is received within a reference time, wherein the operation completion information includes success or failure indication information of a command corresponding to the request message, wherein, when the request message is the normal response request message, the response output controller outputs the message response when the operation completion information is received, and wherein, when the request message is the priority response request message, the response output controller outputs the message response based on whether the operation completion information has been received within the reference time defined by the priority response request message.

* * * * *